(12) United States Patent
He et al.

(10) Patent No.: US 11,401,599 B2
(45) Date of Patent: Aug. 2, 2022

(54) EROSION RESISTANT METAL SILICATE COATINGS

(71) Applicant: Applied Materials, Inc., Santa Clara, CA (US)

(72) Inventors: Xiao-Ming He, Fremont, CA (US); Cheng-Hsuan Chou, Sunnyvale, CA (US); Jennifer Y. Sun, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 231 days.

(21) Appl. No.: 16/444,701

(22) Filed: Jun. 18, 2019

(65) Prior Publication Data

US 2019/0382880 A1    Dec. 19, 2019

Related U.S. Application Data

(60) Provisional application No. 62/686,409, filed on Jun. 18, 2018.

(51) Int. Cl.
| | |
|---|---|
| *C23C 16/40* | (2006.01) |
| *C23C 14/08* | (2006.01) |
| *C23C 16/455* | (2006.01) |
| *C23C 16/02* | (2006.01) |
| *C23C 14/04* | (2006.01) |
| *C23C 14/34* | (2006.01) |

(52) U.S. Cl.
CPC ............ *C23C 14/08* (2013.01); *C23C 14/046* (2013.01); *C23C 14/34* (2013.01); *C23C 16/0281* (2013.01); *C23C 16/401* (2013.01); *C23C 16/405* (2013.01); *C23C 16/45525* (2013.01); *B23B 2228/10* (2013.01); *B23B 2228/36* (2013.01); *Y10T 428/2949* (2015.01)

(58) Field of Classification Search
CPC ............ B23B 2228/10; B23B 2228/36; C23C 16/401; C23C 16/402
USPC ........................................................ 428/701
See application file for complete search history.

(56) References Cited

U.S. PATENT DOCUMENTS

| | | | |
|---|---|---|---|
| 5,352,656 A | 10/1994 | Lackey et al. | |
| 5,688,331 A | 11/1997 | Aruga et al. | |
| 6,156,395 A | 12/2000 | Zhang et al. | |
| 6,969,539 B2 | 11/2005 | Gordon et al. | |
| 2002/0098391 A1* | 7/2002 | Tanaka ................ | C04B 41/5024 428/697 |
| 2002/0110698 A1 | 8/2002 | Singh | |
| 2008/0213496 A1 | 9/2008 | Sun et al. | |
| 2013/0216821 A1 | 8/2013 | Sun et al. | |
| 2014/0261080 A1* | 9/2014 | Lee ......................... | C23C 14/08 106/286.5 |

(Continued)

FOREIGN PATENT DOCUMENTS

WO    2018/083174    5/2018

OTHER PUBLICATIONS

Sun, et al., "Recent progress on synthesis, multi-scale structure, and properties of Y—Si—O oxides," International Materials Reviews, 2014, vol. 59, No. 7, pp. 357-383, Maney.

*Primary Examiner* — Archene A Turner
(74) *Attorney, Agent, or Firm* — Lowenstein Sandler LLP

(57) ABSTRACT

Disclosed are rare earth metal containing silicate coatings, coated articles (e.g., heaters and susceptors) or bodies of articles and methods of coating such articles with a rare earth metal containing silicate coating.

13 Claims, 7 Drawing Sheets

(56) References Cited

U.S. PATENT DOCUMENTS

| | | |
|---|---|---|
| 2014/0263272 A1 | 9/2014 | Duan et al. |
| 2015/0307982 A1 | 10/2015 | Firouzdor et al. |
| 2016/0108510 A1* | 4/2016 | Kirby .................. C23C 4/12 |
| | | 428/215 |
| 2017/0110313 A1 | 4/2017 | Tang et al. |
| 2017/0140902 A1* | 5/2017 | Simpson ................ C23C 16/46 |
| 2017/0250057 A1* | 8/2017 | Simpson ........... H01J 37/32522 |
| 2019/0256405 A1* | 8/2019 | Lee ........................ C03C 8/02 |
| 2019/0272991 A1* | 9/2019 | Nguyen ............ H01J 37/32715 |

* cited by examiner

000
EROSION RESISTANT METAL SILICATE COATINGS

CROSS REFERENCE TO RELATED APPLICATION(S)

This application claims the benefit of U.S. Provisional Application No. 62/686,409, filed Jun. 18, 2018, the disclosure of which is hereby incorporated by reference herein in its entirety.

TECHNICAL FIELD

Embodiments of the disclosure relate to rare earth metal containing silicate coatings, coated articles (e.g., heaters and susceptors) or bodies of articles and methods of coating such articles with a rare earth metal containing silicate coating.

BACKGROUND

Susceptors and heaters are important components in semiconductor processing chambers, for example, because they hold substrates during coating processes and/or implement surface modifications of substrates through various heating processes. Depending on the nature of a particular process step, susceptors and heaters typically operate at temperatures of about 400° C. or higher while coming into contact with process gases. Upon cooling, the process gases may sublimate on the susceptors and heaters causing a buildup of unwanted residue that may be released as particulates during a subsequent process step. To minimize such buildup and particle generation, the susceptors and heaters, together with other components in the process chamber, are subjected to in-situ chamber cleaning typically using various plasma chemistries (e.g., fluorine-based plasmas).

Susceptors and heaters are subject to surface contamination and deposition by reactive process gases, which causes process drift (e.g., in temperature control) over time. In addition, the materials generally used to form susceptors and heaters are subject to erosion by plasmas (e.g., fluorine-containing plasmas) at temperatures of about 400° C. or higher.

To protect susceptors and heaters it is desirable to coat these components with a plasma resistant coating. However, known plasma resistant coatings are ineffective to protect these components at high temperatures of about 400° C. or higher, or more particularly, of about 700° C. or higher. For example, traditional plasma resistant coatings formed by plasma spray (PS) processes do not provide good adhesion to SiC, TaC or AlN at high temperatures. Accordingly, there is a need for plasma resistant coatings that have good adhesion to susceptors and heaters, that do not affect the heating properties of the susceptors and heaters and that do not delaminate or erode in the presence of plasmas at temperatures of about 400° C. or higher.

SUMMARY

Embodiments herein relate to an article comprising a body; and a rare earth metal containing silicate coating on a surface of the body, the rare earth metal containing silicate coating having a thickness of about 3 nm to about 250 μm, wherein the rare earth metal containing silicate coating comprises a material selected from a group consisting of yttrium monosilicate ($Y_2SiO_5$), yttrium disilicate ($Y_2Si_2O_7$), erbium monosilicate ($Er_2SiO_5$), erbium disilicate ($Er_2Si_2O_7$), tantalum monosilicate ($Ta_2SiO_5$), tantalum disilicate ($Ta_2Si_2O_7$), iridium monosilicate ($Ir_2SiO_5$), iridium disilicate ($Ir_2Si_2O_7$), rhodium monosilicate ($Rh_2SiO_5$), rhodium disilicate ($Rh_2Si_2O_7$), lanthanum monosilicate ($La_2SiO_5$), lanthanum disilicate ($La_2Si_2O_7$), lutetium monosilicate ($Lu_2SiO_5$), lutetium disilicate ($Lu_2Si_2O_7$), scandium monosilicate ($Sc_2SiO_5$), scandium disilicate ($Sc_2Si_2O_7$), gadolinium monosilicate ($Gd_2SiO_5$), gadolinium disilicate ($Gd_2Si_2O_7$), samarium monosilicate ($Sm_2SiO_5$), samarium disilicate ($Sm_2Si_2O_7$), dysprosium monosilicate ($Dy_2SiO_5$), dysprosium disilicate ($Dy_2Si_2O_7$) and combinations thereof.

Embodiments described herein further relate to a method comprising performing a deposition process to deposit a rare earth metal containing silicate coating on a surface of a chamber component for a processing chamber, wherein the rare earth metal containing silicate coating has a thickness of about 5 nm to about 250 μm, and optionally, performing a PVD or PEPVD deposition process to deposit a thick rare earth metal silicate layer above or below the rare earth metal containing silicate coating, and wherein the rare earth metal containing silicate coating comprises a material selected from a group consisting of yttrium monosilicate ($Y_2SiO_5$), yttrium disilicate ($Y_2Si_2O_7$), erbium monosilicate ($Er_2SiO_5$), erbium disilicate ($Er_2Si_2O_7$), tantalum monosilicate ($Ta_2SiO_5$), tantalum disilicate ($Ta_2Si_2O_7$), iridium monosilicate ($Ir_2SiO_5$), iridium disilicate ($Ir_2Si_2O_7$), rhodium monosilicate ($Rh_2SiO_5$), rhodium disilicate ($Rh_2Si_2O_7$), lanthanum monosilicate ($La_2SiO_5$), lanthanum disilicate ($La_2Si_2O_7$), lutetium monosilicate ($Lu_2SiO_5$), lutetium disilicate ($Lu_2Si_2O_7$), scandium monosilicate ($Sc_2SiO_5$), scandium disilicate ($Sc_2Si_2O_7$), gadolinium monosilicate ($Gd_2SiO_5$), gadolinium disilicate ($Gd_2Si_2O_7$), samarium monosilicate ($Sm_2SiO_5$), samarium disilicate ($Sm_2Si_2O_7$), dysprosium monosilicate ($Dy_2SiO_5$), dysprosium disilicate ($Dy_2Si_2O_7$) and combinations thereof.

Embodiments described herein further relate to a method comprising performing an atomic layer deposition process to deposit a rare earth metal containing silicate coating on a surface of a heater comprising aluminum nitride or a susceptor comprising graphite coated with silicon carbide, tantalum carbide or a combination thereof; and optionally, performing a PVD or PEPVD deposition process to deposit a thick rare earth metal silicate layer above or below the rare earth metal containing silicate coating, wherein the rare earth metal containing silicate coating has a thickness of about 3 nm to about 20 μm, and wherein the rare earth metal is selected from group consisting of yttrium erbium, tantalum, iridium, rhodium, lanthanum, lutetium, scandium, gadolinium, samarium, dysprosium, and combinations thereof.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
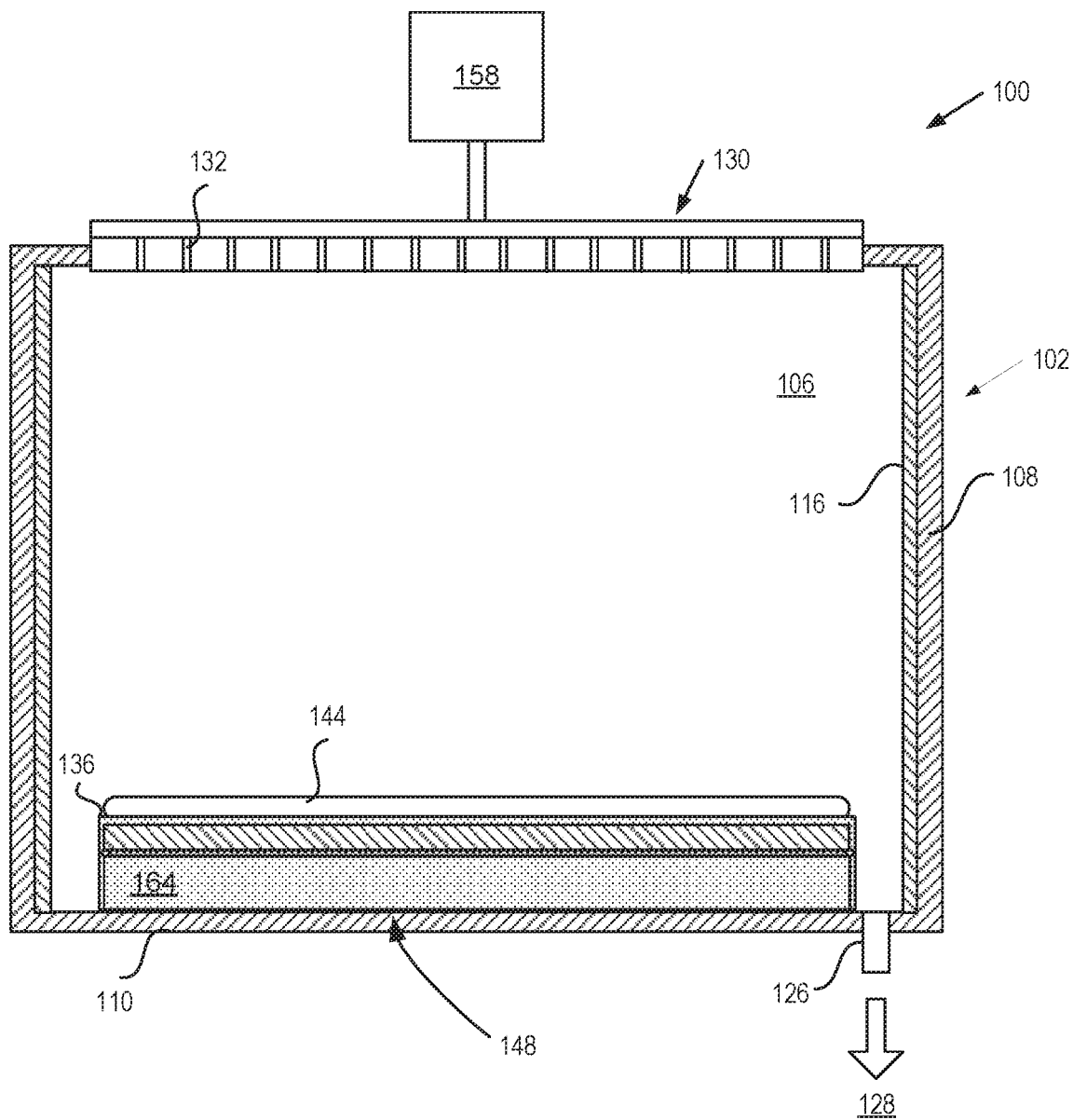
FIG. 1 depicts a sectional view of a processing chamber.

Embodiments of the disclosure relate to rare earth silicate coatings, coated articles (e.g., chamber components such as susceptors and heaters) having a rare earth metal containing silicate coating, methods of forming such coated articles with a rare earth metal containing silicate coating and methods of use of such coatings and coated articles. The rare earth metal containing silicate coating may have a similar thermal expansion as an underlying material of a body of the article (e.g., a heater or susceptor) and/or a similar elastic modulus expansion as the underlying material. The term "body" used herein refers to the main section of an article. The article may be a chamber component of a processing chamber. For example, the article may be a heater assembly and the body may be or include one or more heating elements of the heater assembly. In another example, the article may be a susceptor assembly, and the body may be or include a main section of the susceptor assembly. The rare earth metal containing silicate coating may be formed using a non-line of sight technique such as atomic layer deposition (ALD), chemical vapor deposition (CVD), or plasma enhanced CVD (PECVD). The rare earth metal containing silicate coating may also be formed by a line-of-sight deposition technique such as physical vapor deposition (PVD) and plasma enhanced PVD (PEPVD). The rare earth metal containing silicate coating may also be formed by the combination of a non-line of sight technique (such as ALD, CVD, PECVD) to create a conformal coating covering the whole surface of the article to protect the surface against reactions with the corrosive process gases, and then a line-of-site deposition technique (such as PVD, PEPVD) to create a thick layer or coating over the non-line of sight coating that is direct contact with the process gases and also the process plasma. In some embodiments, the rare earth metal containing silicate coating may also be formed by the combination of a line-of-sight deposition technique (such as PVD, PEPVD) to create a thick coating over the surface of the article and a non-line of sight technique (such as ALD, CVD, PECVD) to create a conformal coating over the line-of-sight thick coating to protect the underlying materials from the corrosive process gases.

According to embodiments described herein, coatings are formed of rare earth metal containing silicates. To provide good thermal conductivity, thermal expansion adaptability, enough mechanical strength, and a stable structure that endures thermal fatigue impacts and thermal oxidation at high-temperatures (e.g., about 400° C. or higher), susceptors for process chambers typically include bodies or components formed of a graphite matrix the outside surface of which is coated with a high density SiC coating, a TaC coating or a combined SiC/TaC coating. Heaters for process chamber typically have bodies or components formed of ceramic materials such as AlN. Susceptors and heaters are subject to buildup of materials on their surfaces resulting from exposure to process gases within the processing chamber. To remove such buildup, in-situ cleaning of the chambers is performed periodically using corrosive plasma chemistries (e.g., fluorine-containing plasmas). However, SiC, TaC, SiC/TaC and AlN are subject to erosion. Accordingly, the coatings described herein are deposited on the surface of the susceptors and/or heaters to protect the underlying materials of the heaters and/or susceptors against corrosion and delamination.

Rare earth metal containing silicate coatings as described herein provide good adhesion to susceptor and heater (e.g., SiC, TaC, SiC/TaC and AlN) materials and do not delaminate or corrode in the presence of corrosive plasmas at high temperatures. Such coatings also have a coefficient of thermal expansion (CTE) and/or an elastic modulus that is similar to materials of the susceptor and heater materials to ensure good adhesion. Additionally, the rare earth metal containing silicate coatings as described herein do not affect the thermal properties of the susceptors and heaters and provide thermal oxidation resistance.

The rare earth metal containing silicate coating includes a rare earth metal (e.g., yttrium, erbium, lanthanum, lutetium, scandium, gadolinium, samarium, dysprosium, etc. also including herein tantalum, iridium and rhodium) and a silicon containing material (e.g., silicon oxide ($Si_xO_y$), silicon carbide (SiC), silicon (Si), silicon carbon oxide ($Si_xC_yO_z$), silicon nitride ($Si_3N_4$), silicon carbon nitride ($Si_xC_yN_z$), silicon oxygen nitride ($Si_xO_yN_z$), etc.). As will be described in more detail below, the coating may be formed by directly depositing a rare earth metal (RE) containing silicate material (e.g., $RE_zSi_xO_y$) or by alternately depositing a rare earth metal containing layer (e.g., $RE_xO_y$) and a $Si_xO_y$ layer and then annealing these layers to form the rare earth metal containing silicate coating. In embodiments, a buffer layer (e.g., of $SiO_2$, Si, SiC, $Si_xC_yO_z$, $Si_xO_yN_z$, $Si_xC_yN_z$, $Si_3N_4$, or other Si containing material) may be deposited prior to deposition of the rare earth metal containing silicate coating. In embodiments, the rare earth metal containing silicate coating may be a multi-layer coating. In embodiments where the rare earth metal containing silicate coating is deposited on an AlN heater, a buffer layer containing one or more of $Si_xO_yN_z$, $Si_xO_yN_z$ and $Si_3N_4$ may be deposited on the surface of the article. In embodiments where the rare earth metal containing silicate coating is deposited on a SiC susceptor, a buffer layer containing one or more of $Si_xC_yO_z$ is included. In embodiments, a rare earth oxide coating may be deposited over the rare earth silicate coating.

In embodiments, the thickness of the rare earth metal containing silicate coating may be about 3 nm to about 250 µm, or about 10 nm to about 100 µm, or about 15 nm to about 50 µm, or about 25 nm to about 50 µm, or about 50 nm to about 10 µm, or about 50 nm to about 5 µm, or about 50 nm to about 1 µm, or about 50 nm to about 500 nm, or about 75 nm to about 200 nm. In some embodiments, the thickness of the rare earth metal containing silicate coating may be about 50 nm, or about 100 nm, or about 500 nm, or about 5 µm, or about 20 µm. The rare earth metal containing silicate coating may conformally cover a surface of the susceptor or heater with a substantially uniform thickness.

The coefficient of thermal expansion (CTE) for SiC is 4.3-5.4×10$^{-6}$/K (at 300-1273 K), the CTE for TaC is 6.3×10$^{-6}$/K, and the CTE for AlN is 4.5×10$^{-6}$/K. In certain embodiments, the CTE of the rare earth metal containing silicate coating is about 4.0×10$^{-6}$/K (at 300-1273 K) to about 6.5×10$^{-6}$/K (at 300-1273 K), or about 4.3×10$^{-6}$/K (at 300-1273 K) to about 6.3×10$^{-6}$/K (at 300-1273 K), or about 4.5×10$^{-6}$/K (at 300-1273 K) to about 6.0×10$^{-6}$/K (at 300-1273 K). In embodiments, the rare earth metal containing silicate coating has a CTE that is within about ±10% of the CTE of the susceptor material or the heater material.

The elastic modulus for SiC is 410 GPa, the elastic modulus for TaC is 330 GPa to 450 GPa and the elastic modulus for AlN is 330 GPa. In certain embodiments, the elastic modulus of the rare earth metal containing silicate coating is about 100 GPa to about 400 GPa, or about 110 GPa to about 300 GPa, or about 120 GPa to about 160 GPa, or about 124 GPa to about 155 GPa.

In embodiments, the rare earth metal containing silicate coating has an elastic modulus that is within about ±10% of the elastic modulus of the susceptor material or the heater material.

According to embodiments, the rare earth metal containing silicate coating may be or include at least one material selected from yttrium monosilicate ($Y_2SiO_5$), yttrium disilicate ($Y_2Si_2O_7$), erbium monosilicate ($Er_2SiO_5$), erbium disilicate ($Er_2Si_2O_7$), tantalum monosilicate ($Ta_2SiO_5$), tantalum disilicate ($Ta_2Si_2O_7$), iridium monosilicate ($Ir_2SiO_5$), iridium disilicate ($Ir_2Si_2O_7$), rhodium monosilicate ($Rh_2Si_2O_7$), rhodium disilicate ($Rh_2SiO_5$), lanthanum monosilicate ($La_2SiO_5$), lanthanum disilicate ($La_2Si_2O_7$), lutetium monosilicate ($Lu_2SiO_5$), lutetium disilicate ($Lu_2Si_2O_7$), scandium monosilicate ($Sc_2SiO_5$), scandium disilicate ($Sc_2Si_2O_7$), gadolinium monosilicate ($Gd_2Si_2O_7$), gadolinium disilicate ($Gd_2Si_2O_7$), samarium monosilicate ($Sm_2SiO_5$), samarium disilicate ($Sm_2Si_2O_7$), dysprosium monosilicate ($Dy_2SiO_5$), dysprosium disilicate ($Dy_2Si_2O_7$) and combinations thereof In certain embodiments, the rare earth metal containing silicate coating includes a mixture of a rare earth metal monosilicate and a rare earth metal disilicate at a volume ratio (monosilicate:disilicate) of about 1:20 to about 20:1, or about 1:15 to about 15:1, or about 1:12 to about 12:1, or about 1:10 to about 10:1, or about 1:8 to about 8:1, or about 1:5 to about 5:1.

In certain embodiments, the rare earth metal containing silicate coating includes at least one of $Y_2SiO_5$ and $Y_2Si_2O_7$ and is resistant to thermal oxidation at temperatures of about 400° C. or higher, or about 700° C. or higher, or about 1,000° C. or higher, or about 1,200° C. or higher. In embodiments, the rare earth metal containing silicate coating includes at least one of $Y_2SiO_5$ and $Y_2Si_2O_7$ and is resistant to thermal oxidation at temperatures of about 400° C. to about 1,500° C., or about 500° C. to about 1,200° C. or higher, or about 700° C. to about 1,000° C.

In certain embodiments, the rare earth metal containing silicate coating may be deposited over a buffer layer/coating on the surface of the article (e.g., a susceptor or heater) material. For example, the buffer layer may be coated onto a SiC, TaC, SiC/TaC or AlN material of the article. The buffer layer may be formed of $SiO_2$, Si, SiC, $Si_xC_yO_z$, $Si_xO_yN_z$, $Si_xC_yN_z$, $Si_3N_4$ or other silicon-containing material with or without an amorphous structure. The buffer layer may enhance adhesion of the rare earth metal containing silicate coating to the susceptor or heater material without the need to reduce the thickness of the coating.

In one embodiment, the rare earth metal containing silicate coating is a multi-layer coating that includes a rare earth disilicate layer (e.g., $Y_2Si_2O_7$), which coated with a rare earth monosilicate (e.g., $Y_2SiO_5$) layer. Such multi-layer coating reduces the residual stress induced by the coating formation and enhances the stability of the coating formed on the susceptor or heater surface. In some embodiments, the multi-layer coating may include a buffer layer as described above and a rare earth monosilicate (e.g., $Y_2SiO_5$) layer as a top layer. Without being bound by any particular theory, it is believed that rare earth monosilicates may be less susceptible to plasma corrosion than rare earth disilicates.

The CTE of yttrium oxide ($Y_2O_3$) is 9.5×10$^{-6}$/K and the elastic modulus of $Y_2O_3$ is 150 GPa to 180 GPa. At high temperatures, a $Y_2O_3$ plasma resistant coating on a susceptor or heater material as described herein may not provide sufficient thermal expansion and adhesion properties. Other rare earth metal containing oxide ($RE_xO_y$) plasma resistant coatings similarly may not provide sufficient thermal expansion and adhesion properties at high temperatures. According to certain embodiments, the rare earth metal containing silicate coatings as described herein do not include $RE_xO_y$ (e.g., $Y_2O_3$) or more than a trace amount of rare earth metal containing oxide in direct contact with the susceptor or heater material. In other embodiments, the rare earth metal containing silicate coating is a multilayer coating where the buffer layer does not contain yttrium oxide ($Y_2O_3$), erbium oxide ($Er_2O_3$), lanthanum oxide ($La_2O_3$), lutetium oxide ($Lu_2O_3$), scandium oxide ($Sc_2O_3$), gadolinium oxide ($Gd_2O_3$), samarium oxide ($Sm_2O_3$) dysprosium oxide ($Dy_2O_3$), tantalum oxide ($Ta_2O_5$), iridium oxide ($Ir_2O_3$) or rhodium oxide ($Rh_2O_3$) although a top layer may contain one or more of these oxides. For example, in certain embodiments the top layer may include a rare earth metal containing oxide selected from $Y_2O_3$, $Er_2O_3$, $Ta_2O_5$, $Ir_2O_3$, $Rh_2O_3$, $La_2O_3$, $Lu_2O_3$, $Sc_2O_3$, $Gd_2O_3$, $Sm_2O_3$, $Dy_2O_3$, a $Y_2O_3$ and $ZrO_2$ solid solution, a mixture of $Y_4Al_2O_9$ and a $Y_2O_3$ and $ZrO_2$ solid solution and combinations thereof. In some embodiments, when the top layer comprises $Y_2O_3$ it may be converted to yttrium (III) fluoride ($YF_3$) and/or yttrium oxyfluoride (YOF) through a fluorination process. The fluorination process can be executed through a wet chemical reaction (e.g. with an acid solution of hydrofluoric acid (HF)), high temperature annealing (i.e., during a reaction with fluorine containing gases), or during in situ fluorine-containing plasma processes within a processing chamber.

In some embodiments, the rare earth metal containing silicate coating is covered by a rare earth oxide coating. The rare earth oxide coating may include a same rare earth material that is included in the rare earth metal containing silicate coating. Alternatively, or additionally, the rare earth oxide coating may include one or more different rare earth metals that are included in the rare earth metal containing silicate coating. In some embodiments, the rare earth oxide layer may be $Y_2O_3$, $Er_2O_3$, $Ta_2O_5$, $Ir_2O_3$, $Rh_2O_3$, $La_2O_3$, $Lu_2O_3$, $Sc_2O_3$, $Gd_2O_3$, $Sm_2O_3$ or $Dy_2O_3$, $Y_3Al_5O_{12}$ (YAG), $Er_3Al_5O_{12}$ (EAG), $Y_4Al_2O_9$ (YAM), $YAlO_3$ (YAP), $Er_4Al_2O_9$ (EAM), $ErAlO_3$ (EAP), a solid solution of $Y_2O_3$-$ZrO_2$, a ceramic compound comprising $Y_4Al_2O_9$ and a solid-solution of $Y_2O_3$-$ZrO_2$, and their combinations.

With reference to the solid-solution of $Y_2O_3$-$ZrO_2$, the rare earth oxide coating may include $Y_2O_3$ at a concentration of 10-90 molar ratio (mol %) and $ZrO_2$ at a concentration of 10-90 mol %. In some examples, the solid-solution of $Y_2O_3$-$ZrO_2$ may include 10-20 mol % $Y_2O_3$ and 80-90 mol % $ZrO_2$, may include 20-30 mol % $Y_2O_3$ and 70-80 mol % $ZrO_2$, may include 30-40 mol % $Y_2O_3$ and 60-70 mol % $ZrO_2$, may include 40-50 mol % $Y_2O_3$ and 50-60 mol %

$ZrO_2$, may include 60-70 mol % $Y_2O_3$ and 30-40 mol % $ZrO_2$, may include 70-80 mol % $Y_2O_3$ and 20-30 mol % $ZrO_2$, may include 80-90 mol % $Y_2O_3$ and 10-20 mol % $ZrO_2$, and so on.

With reference to the ceramic compound comprising $Al_2O_9$ and a solid-solution of $Y_2O_3\_ZrO_2$, in one embodiment the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0.1-60 mol % and $Al_2O_3$ in a range of 0.1-10 mol %. In another embodiment, the ceramic compound can include $Y_2O_3$ in a range of 40-60 mol %, $ZrO_2$ in a range of 35-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 80-90 mol %, $ZrO_2$ in a range of 0.1-20 mol % and $Al_2O_3$ in a range of 10-20 mol %. In another embodiment, the ceramic compound can include $Y_2O_3$ in a range of 60-80 mol %, $ZrO_2$ in a range of 0.1-10 mol % and $Al_2O_3$ in a range of 20-40 mol %. In another embodiment, the ceramic compound can include $Y_2O_3$ in a range of 40-60 mol %, $ZrO_2$ in a range of 0.1-20 mol % and $Al_2O_3$ in a range of 30-40 mol %. In other embodiments, other distributions may also be used for the ceramic compound.

In embodiments, the rare earth oxide coating may have a thickness of a few nanometers (e.g., 1-2 nm) to about 250 microns, or about 3 nm to about 200 microns, or about 3 nm to about 100 microns, or about 3 nm to about 20 microns. Any of the aforementioned rare earth oxide coatings may include trace amounts of other materials such as $ZrO_2$, $Al_2O_3$, $SiO_2$, $B_2O_3$, $Y_2O_3$, $Er_2O_3$, $Ta_2O_5$, $Ir_2O_3$, $Rh_2O_3$, $Nd_2O_3$, $Nb_2O_5$, $CeO_2$, $Sm_2O_3$, $Yb_2O_3$, or other oxides.

In some embodiments, a rare earth oxy-fluoride coating covers the rare earth metal containing silicate coating. The rare earth oxy-fluoride coating may include any of the aforementioned rare earth oxide coatings with a portion of the oxygen replaced with fluorine. Accordingly, the rare earth oxy-fluoride coating may be a Y—O—F coating, a Y—Zr—O—F coating, a Er—O—F coating, and so on.

In some embodiments, the rare earth metal containing silicate coating is covered by any of the aforementioned rare earth oxide coatings, and the rare earth oxide coating is covered by a rare earth oxy-fluoride coating or a rare earth fluoride coating. For example, a surface of any of the aforementioned rare earth oxide coatings may have undergone a fluorination process to convert the surface of the rare earth oxide coating to a rare earth oxy-fluoride coating or a rare earth fluoride coating. For example, the rare earth oxide coating may be $Y_2O_3$, and it may be covered by a coating of Y—O—F or $YF_3$. The rare earth oxy-fluoride coating or rare earth fluoride coating may have a thickness of a few nanometers (e.g., 1-2 nm) to about 20 microns. In some embodiments, the rare earth oxy-fluoride coating or the rare earth fluoride coating has a thickness of about 1 nm to about 200 nm, or about 1 nm to about 50 nm, or about 1 nm to about 30 nm.

As will be described in more detail with reference to FIGS. 3A-3C, a buffer layer may be deposited on the surface of the article or the body of the article and/or the coating may be a multi-layer stack having alternating layers of a rare earth metal monosilicate and a rare earth metal disilicate.

The rare earth metal of the monosilicate and the disilicate may be independently selected from yttrium (Y), erbium (Er), tantalum (Ta), iridium (Ir), rhodium (Rh), lanthanum (La), lutetium (Lu), scandium (Sc), gadolinium (Gd), samarium (Sm) and dysprosium (Dy).

In certain embodiments, the rare earth metal containing silicate coating includes one or more of a) a solid solution of a rare earth metal monosilicate and a rare earth metal disilicate, b) a mixed phase material of a rare earth metal monosilicate and a rare earth metal disilicate, c) a rare earth metal disilicate or a rare earth metal monosilicate, d) yttria, and e) silica. The rare earth metal containing silicate coating may include about 50 mol % to about 80 mol % $Y_2O_3$ and about 50 mol % to about 20 mol % $SiO_2$. For example, a buffer layer/coating may be deposited prior to deposition of the rare earth metal containing silicate coating and/or a rare earth metal containing oxide layer/coating may cover the rare earth metal containing silicate coating.

In one embodiment, the rare earth metal containing silicate coating may have one or more layers having a polycrystalline structure. In other embodiments, the rare earth metal containing silicate coating may have one or more layers having an amorphous structure.

In embodiments the rare earth metal containing silicate coating is a conformal coating having an approximately zero porosity (e.g., a porosity of less than 0.1 vol %). The conformal rare earth metal containing silicate coating may also conformally cover surface features of the underlying article with a substantially uniform thickness. In one embodiment, the rare earth metal containing silicate coating has a conformal coverage of the underlying surface that is coated (including coated surface features) with a uniform thickness having a thickness variation of less than about +/−20%, a thickness variation of +/−10%, a thickness variation of +/−5%, or a lower thickness variation.

Also described herein are articles having a rare earth metal containing silicate coating. In embodiments, the article may be a heater having a body formed of an aluminum nitride heater material. In embodiments, the article may be a susceptor having a body formed of a graphite or graphite composite material coated with silicon carbide, tantalum carbide or a combination thereof. The article may also be any other type of article for use in a processing chamber, such as an electrostatic chuck, a gas delivery plate, a showerhead, a chamber liner, a door, a ring, and so on. The rare earth metal containing silicate coating may have a thickness of about 3 nm to about 250 μm and may include a material selected from yttrium monosilicate ($Y_2SiO_5$), yttrium disilicate ($Y_2Si_2O_7$), erbium monosilicate ($Er_2SiO_5$), erbium disilicate ($Er_2Si_2O_7$), tantalum monosilicate ($Ta_2SiO_5$), tantalum disilicate ($Ta_2Si_2O_7$), iridium monosilicate ($Ir_2SiO_5$), iridium disilicate ($Ir_2Si_2O_7$), rhodium monosilicate ($Rh_2Si_2O_7$), rhodium disilicate ($Rh_2SiO_5$), lanthanum monosilicate ($La_2SiO_5$), lanthanum disilicate ($La_2Si_2O_7$), lutetium monosilicate ($Lu_2SiO_5$), lutetium disilicate ($Lu_2Si_2O_7$), scandium monosilicate ($Sc_2SiO_5$), scandium disilicate ($Sc_2Si_2O_7$), gadolinium monosilicate ($Gd_2Si_2O_7$), gadolinium disilicate ($Gd_2Si_2O_7$), samarium monosilicate ($Sm_2SiO_5$), samarium disilicate ($Sm_2Si_2O_7$), dysprosium monosilicate ($Dy_2SiO_5$), dysprosium disilicate ($Dy_2Si_2O_7$) and combinations thereof.

In some embodiments, the rare earth metal containing silicate coating on the article (e.g., the heater or susceptor) may include a buffer layer, a rare earth metal silicate layer containing at least one of a monosilicate or a disilicate selected from yttrium monosilicate ($Y_2SiO_5$), yttrium disilicate ($Y_2Si_2O_7$), erbium monosilicate ($Er_2SiO_5$), erbium disilicate ($Er_2Si_2O_7$), tantalum monosilicate ($Ta_2SiO_5$), tantalum disilicate ($Ta_2Si_2O_7$), iridium monosilicate ($Ir_2SiO_5$), iridium disilicate ($Ir_2Si_2O_7$), rhodium monosilicate ($Rh_2SiO_5$), rhodium disilicate ($Rh_2SiO_5$), lanthanum monosilicate ($La_2SiO_5$), lanthanum disilicate ($La_2Si_2O_7$), lutetium monosilicate ($Lu_2SiO_5$), lutetium disilicate ($Lu_2Si_2O_7$), scandium monosilicate ($Sc_2SiO_5$), scandium disilicate ($Sc_2Si_2O_7$), gadolinium monosilicate ($Gd_2SiO_5$), gadolinium disilicate ($Gd_2Si_2O_7$), samarium monosilicate ($Sm_2SiO_5$), samarium disilicate ($Sm_2Si_2O_7$), dysprosium monosilicate ($Dy_2SiO_5$), dysprosium disilicate ($Dy_2Si_2O_7$) and combinations thereof, and a rare earth metal containing oxide layer covering the rare earth metal silicate layer, the rare earth metal oxide selected from yttrium oxide ($Y_2O_3$), erbium oxide ($Er_2O_3$), tantalum oxide ($Ta_2O_5$), iridium oxide ($Ir_2O_3$), rhodium ($Rh_2O_3$), lanthanum oxide ($La_2O_3$), lutetium oxide ($Lu_2O_3$), scandium oxide ($Se_2O_3$), gadolinium oxide ($Gd_2O_3$), samarium oxide ($Sm_2O_3$) dysprosium oxide ($Dy_2O_3$) and combinations thereof.

In some embodiments the article (e.g., a susceptor or heater) or the body of the article may include at least one gas hole, wherein the gas hole has an aspect ratio of length to diameter (L:D) of about 5:1 to about 100:1, or about 7:1 to about 50:1, or about 10:1 to about 25:1. The rare earth metal containing silicate coating may conformally cover the body of the article and a surface of the gas hole. In some embodiments, the article or the body of the article may include a feature having an aspect ratio of depth to width (D:W) of about 5:1 to about 100:1, or about 7:1 to about 50:1, or about 10:1 to about 20:1. The rare earth metal containing silicate coating may conformally cover the body of the article and a surface of the feature.

In some embodiments, the article (e.g., a susceptor) includes a body having silicon carbide on a surface thereof, and the rare earth metal containing silicate coating contains at least about 50 vol % to about 80 vol % of a yttrium silicate and up to about 20 vol %, or up to about 30 vol %, or up to about 40 vol %, or up to about 50 vol %, or about 20 vol % to about 50 vol % of other phases (e.g., $Y_2O_3$, $SiO_2$, etc.). In some embodiments, the article (e.g., a susceptor) includes a body having tantalum carbide on a surface thereof, and the rare earth metal containing silicate coating contains at least about 50 mol %, or at least about 60 mol %, or at least about 70 mol %, or at least about 80 mol %, or about 50 vol % to about 80 vol % of a rare earth metal containing silicate and up to about 20 vol %, or up to about 30 vol %, or up to about 40 vol %, or up to about 50 vol %, or about 20 vol % to about 50 vol % of other phases (e.g., $RE_xO_y$, $SiO_2$, etc.). In yet further embodiments, the article (e.g., a heater) includes a body formed of aluminum nitride and the rare earth metal containing silicate coating contains about 50 vol % to about 80 vol % of rare earth metal containing silicate(s) and about 20 vol % to about 50 vol % of other phases (e.g., $RE_xO_y$, $SiO_2$, etc.).

Embodiments are discussed herein with regards to rare earth metal containing silicate coatings on heaters and susceptors. However, embodiments discussed with regards to heaters and susceptors also apply to other chamber components of processing chambers such as electrostatic chucks (ESCs), gas delivery plates, showerheads, lids, nozzles, chamber liners, rings, view ports, and so on.

FIG. 1 is a sectional view of a semiconductor processing chamber 100 having one or more chamber components that are coated with a rare earth metal containing silicate coating in accordance with embodiments described herein. The base materials of at least some components of the chamber may include one or more of aluminum (Al), titanium (Ti) and stainless steel (SST). The processing chamber 100 may be used for processes in which a corrosive plasma environment having plasma processing conditions is provided. For example, the processing chamber 100 may be a chamber for a plasma etcher or plasma etch reactor, a plasma cleaner, CVD, a metalorganic chemical vapor deposition (MOCVD) chamber, plasma enhanced CVD, PVD or ALD reactors and so forth. An example of an article that may include a rare earth metal containing silicate coating is a susceptor or a heater.

In one embodiment, the processing chamber 100 includes a chamber body 102 and a showerhead 130 that encloses an interior volume 106. The showerhead 130 may include a showerhead base and a showerhead gas distribution plate. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material such as titanium (Ti). The chamber body 102 generally includes sidewalls 108 and a bottom 110. An outer liner 116 may be disposed adjacent the sidewalls 108 to protect the chamber body 102.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 of the chamber body 102. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 may be used for processing chambers used for dielectric etch (etching of dielectric materials). The showerhead 130 may include a gas distribution plate (GDP) and may have multiple gas delivery holes 132 throughout the GDP. The showerhead 130 may include the GDP bonded to an aluminum base or an anodized aluminum base. The GDP may be made from Si or SiC, or may be a ceramic such as $Y_2O_3$, $Al_2O_3$, $Y_3Al_5O_{12}$ (YAG), and so forth.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$-$ZrO_2$. The nozzle may also be a ceramic, such as $Y_2O_3$, YAG, or the ceramic compound comprising $Y_4Al_2O_9$ and a solid-solution of $Y_2O_3$-$ZrO_2$.

Examples of processing gases that may be used to process substrates in the processing chamber 100 include halogen-containing gases, such as $CF_4$, $C_2F_6$, $C_4F_8$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, $H_2$, or $N_2O$. Examples of carrier gases include $N_2$, He, Ar, and other gases inert to process gases (e.g., non-reactive gases).

A heater assembly 148 is disposed in the interior volume 106 of the processing chamber 100 below the showerhead 130 or lid. The heater assembly 148 includes a support 136 that holds a substrate 144 during processing. The support 136 is attached to the end of a shaft (not shown) that is coupled to the chamber body 102 via a flange 164. The support 136, shaft and flange 164 may be constructed of a heater material containing AlN, for example, an AlN ceramic. The support 136 may further include mesas 156 (e.g., dimples or bumps) (not shown). The support 136 may additionally include wires, for example, tungsten wires (not shown), embedded within the heater material of the support 136. In one embodiment, the support 136 may include metallic heater and sensor layers that are sandwiched between AlN ceramic layers. Such an assembly may be sintered in a high-temperature furnace to create a monolithic assembly. The layers may include a combination of heater circuits, sensor elements, ground planes, radio frequency grids and metallic and ceramic flow channels. The heater assembly 148 may provide a heater temperature of up to about 650° C. under vacuum conditions (e.g., about 1 mTorr to about 5 Torrs). A rare earth metal containing silicate coating in accordance with embodiments described herein may be deposited on the support 150 or on all surfaces of the heater assembly 148 (including the support 136, shaft and flange 154) within the chamber 100.

In alternative embodiments, the heater assembly 148 may be replaced by a susceptor (not shown), which may be coated by a rare earth metal containing silicate coating. Additionally, or alternatively, other components of the processing chamber 100 may be coated with the rare earth metal containing silicate coating, such as the showerhead 130, outer liner 116, and so on.

Figure 2A:
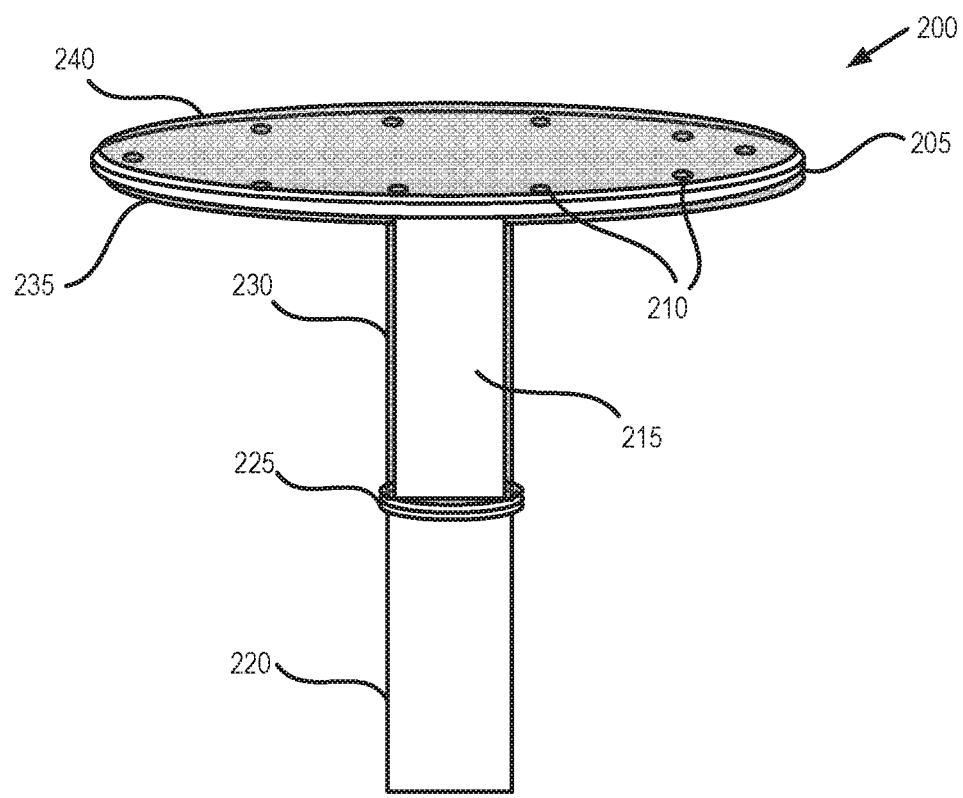
FIG. 2A depicts a heater assembly with components having a rare earth metal containing silicate coating in accordance with embodiments.

FIG. 2A depicts a heater assembly 200 having coated components and/or a coated body in accordance with embodiments described herein. The heater assembly 200 includes a support 205 attached to an end of an interior shaft 215. The interior shaft 215 is situated within the interior volume of the processing chamber (not shown). The interior shaft is attached to an exterior shaft 220 via a flange 225. The support 205 includes mesas 210. All surfaces that may be exposed to corrosive gases and plasmas within the processing chamber may be coated with a rare earth metal containing silicate coating 240 in accordance with embodiments described herein.

The rare earth metal containing silicate coating 240 may comprise one or more earth metal containing silicate material on a surface of the support 205 and/or on all surfaces of the heater assembly that may be exposed to corrosive gases or plasma within the processing chamber. The rare earth metal containing silicate coating may be a single-layer coating having little or no impact on the thermal properties of the heater material of the support 205 or on the performance of the heater generally. The single-layer rare earth metal containing silicate coating may have a thickness of about 3 nm to about 250 µm, or about 10 nm to 100 µm, or about 15 nm to 50 µm, or about 25 nm to 50 µm, or about 50 nm to 10 µm, or about 50 nm to 5 µm, or about 50 nm to 10 µm, or about 50 nm to about 500 nm, or about 75 nm to about 200 nm. In some embodiments, the thickness of the rare earth metal containing silicate coating may be about 50 nm, or about 100 nm, or about 500 nm, or about 5 µm, or about 20 µm, or about 250 µm. In some embodiments, the thickness of the single-layer rare earth metal containing silicate coating may be about 50 nm, or about 75 nm, or about 100 nm, or about 125 nm, or about 150 nm. The rare earth metal containing silicate coating may alternatively be a multi-layer coating having two or more layers. For example, a first layer may be a rare earth metal containing monosilicate and a second layer may be a rare earth metal containing disilicate. In another example, the rare earth metal containing silicate coating may include alternating layers of a rare earth metal containing monosilicate and a rare earth metal containing disilicate. The rare earth metal containing silicate coating may have a total thickness of about 3 nm to about 250 µm in embodiments. One or more parts of the heater assembly 200 may also be coating with a buffer layer underneath the rare earth metal containing silicate layer and/or a rare earth oxide layer over the rare earth metal containing silicate layer. The rare earth metal containing silicate coating used on the one or more parts of the heater assembly 200 may also include any of the other embodiments of a rare earth metal containing silicate coating discussed elsewhere herein.

The heater may include one or more body formed from an aluminum nitride (AlN) material or other suitable material having a comparable chemical resistance and mechanical, thermal and electrical properties. The heater material may have embedded therein, wires (e.g., tungsten wires) to supply electricity. In embodiments, the heater material may be an AlN ceramic, a silicon carbide (SiC) ceramic, an aluminum oxide ($Al_2O_3$) ceramic or any combination thereof. Different heater materials may have different reaction properties such that one composition may form a reactant with a higher vapor pressure than another composition when exposed to high temperatures, low vacuum pressures and aggressive chemistries. For example, when a typical high temperature heater having an AlN material ceramic is exposed to nitrogen trifluoride ($NF_3$) plasma under high temperature (e.g., up to about 650° C.) and vacuum conditions (e.g., about 50 mTorr to about 200 mTorr), the reaction produces aluminum trifluoride ($AlF_3$). The $AlF_3$ is able to sublime and deposit onto components within the chamber. During a subsequent process step, the deposited material may peel or flake or otherwise detach from the other chamber components and deposit as particles onto a wafer therein resulting in defects. Providing a rare earth metal containing silicate coating on the heater can provide resistance to thermal oxidation at high temperatures (e.g., at least about 1,000 ° C.) and resistance to fluorination. The rare earth metal containing silicate coating can also be dense with a porosity of about 0% (e.g., the rare earth metal containing silicate coating can be porosity-free in embodiments). The rare earth metal containing silicate coatings also can be resistant to corrosion and erosion from plasma etch chemistries, such as $CCl_4$/$CHF_3$ plasma etch chemistries, $HCl_3Si$ etch chemistries and $NF_3$ etch chemistries.

Figure 2B:
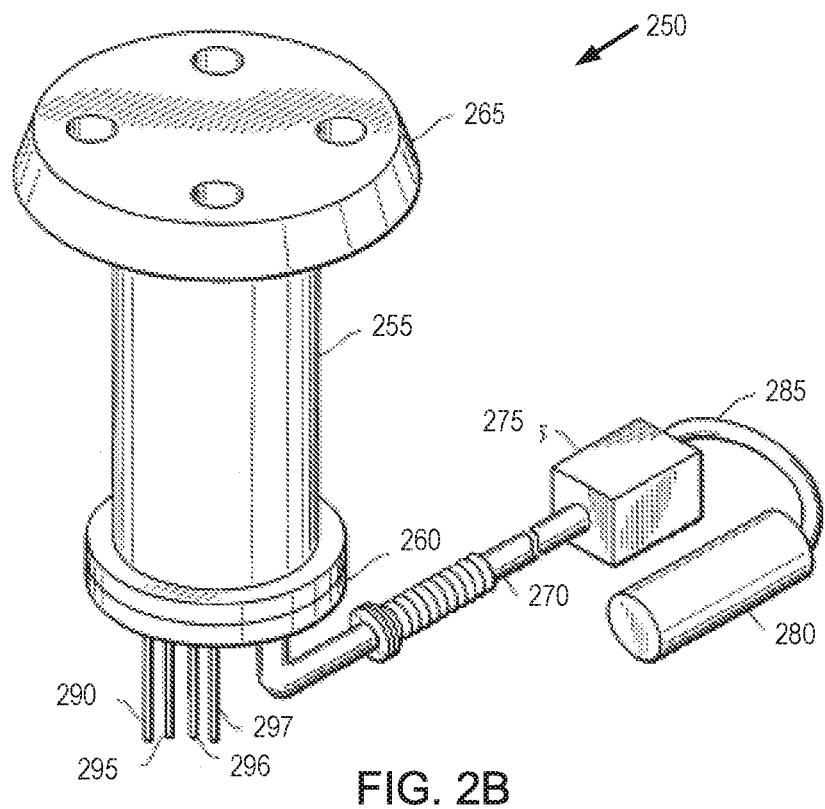
FIG. 2B depicts a susceptor assembly with components having a rare earth metal containing silicate coating in accordance with embodiments.

FIG. 2B depicts a susceptor assembly having one or more body such as a susceptor block (wafer support plate) 265 and a support stand (cylindrical member) 255 with a bottom plate 260. A gas feeding tube 270 is connected to the bottom plate 260 of cylindrical member 255. Wiring leads 295, 296 for a heater (not shown), wiring leads 297 for a thermocouple (not shown), and a lead 290 to a high-frequency metallic electrode (not shown) are routed to pass through the bottom plate 265 of cylindrical member 255. The gas feeding tube 270 is connected to a mass flow controller 275 through a flexible tube 285. The mass flow controller 275 may be connected to a gas cylinder 280 through a gas pipe (not shown). The susceptor support plate 265 may be formed of, for example, a graphite or graphite composite material coated with, for example, SiC, TaC or a combination of SiC/TaC.

Some or all surfaces of the susceptor assembly 250 that may be exposed to corrosive gases and/or plasmas are coated with a rare earth metal containing silicate coating in accordance with embodiments described herein. Additionally, some or all surfaces of the susceptor assembly 250 that are exposed to corrosive gases and/or plasmas may also be coating with a buffer layer underneath the rare earth metal containing silicate coating and/or a rare earth oxide layer over the rare earth metal containing silicate coating. The susceptor wafer support plate 265 may be mounted on the top surface of the cylindrical member 255 and attached with screws (not shown), which also may be coated with the rare earth metal containing silicate coating. The flat susceptor wafer support plate 265 may be mounted to the bottom surface of the cylindrical member 255 also with screws (not shown), which can be coated with the rare earth metal containing silicate coating as described herein.

Coatings according to embodiments described herein may be formed using a deposition process selected from chemical vapor deposition (CVD), plasma enhanced chemical vapor deposition (PECVD), physical vapor deposition (PVD), plasma enhanced physical vapor deposition (PEPVD) and atomic layer deposition (ALD). CVD is a well-known technique for depositing pure metal coatings. In a typical CVD process, a substrate is exposed to at least one volatile precursor under ultra-high vacuum conditions. The at least one precursor reacts or decomposes on the substrate surface to form a film. The reaction chamber is subsequently purged with inert gas flowing there-through. In a PECVD process, chemical reactions are initiated by the creation of a plasma of the reactive precursor gases. In an ALD process, a thin film layer is grown by repeatedly exposing the surface of a substrate to pulses of gaseous chemical precursors that chemically react with the surface one at a time in a self-limiting manner. CVD and ALD are non-line-of-sight processes that may be used to coat high aspect ratio features. A PVD process also takes place under vacuum conditions and typically involves sputtering and/or evaporation of a target material to form a gas that deposits and/or reacts on a surface of the substrate. PVD (typically, including evaporation, plasm spray, etc.) is a line-of-sight process. In a PEPVD process (typically, including ion assisted deposition, ion assisted evaporation deposition, ion assisted sputtering deposition, ion plating, etc.), the plasma or energetic ions are generated to react with deposition materials from the PVD processes, such as the ion beams, and involve sputtering or evaporation of target materials. PEPVD is a line-of-sight process, but can be modified as a non-line-of-sight process in cases where the substrate is biased during the deposition processes. As compared to ALD, PVD and PEPVD can deposit a relatively thick rare earth metal containing silicate or oxide layer or coating (up to about 500 µm, or up to about 250 µm, or from about 5 µm to about 250 µm) at a relatively low deposition temperature (<200° C.).

Figure 3A:
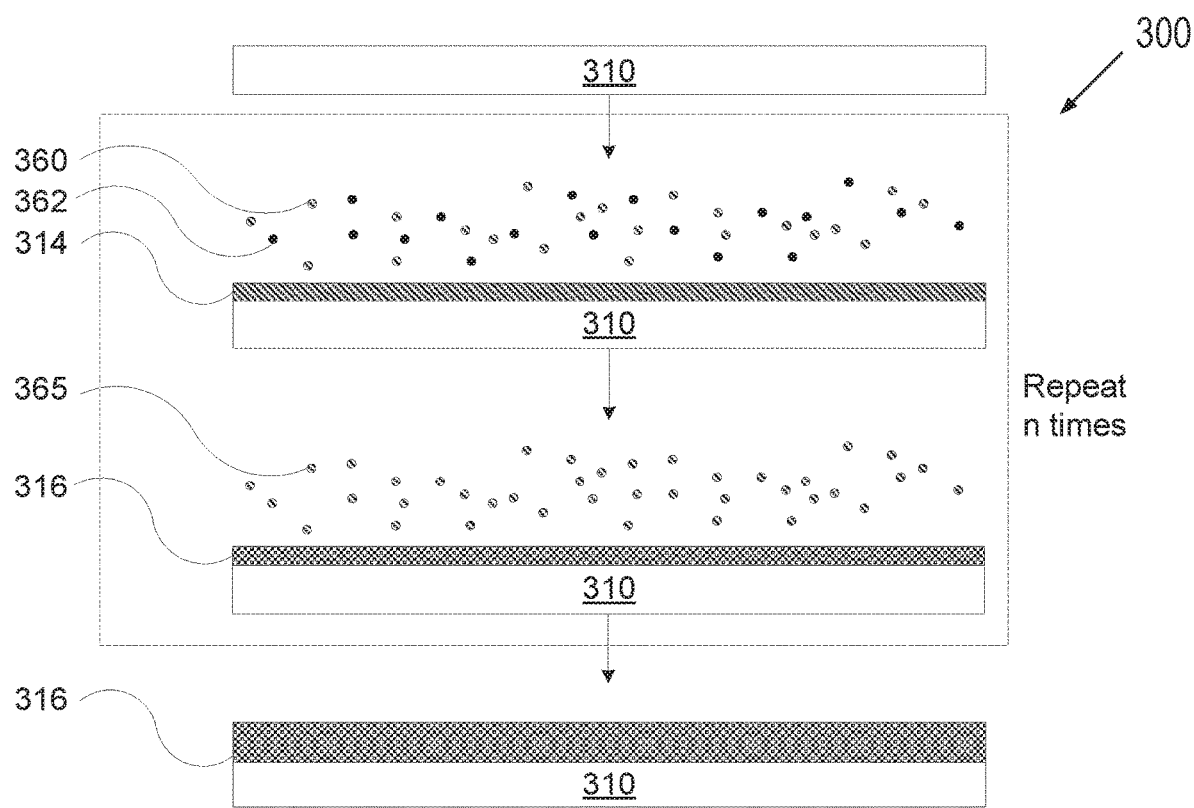
FIG. 3A depicts one embodiment of a deposition process in accordance with an atomic layer deposition technique as described herein.

FIG. 3A depicts an embodiment of an atomic layer deposition (ALD) process 300 for growing or depositing a rare earth metal containing silicate coating on an article (e.g., a heater or susceptor support or entire heater or susceptor assembly). FIG. 3B depicts one embodiment of an ALD deposition process 301 to grow or deposit a rare earth metal containing silicate coating on an article. FIG. 3C depicts another embodiment of an ALD deposition process 302 as described herein. FIG. 3D depicts an embodiment of a hybrid deposition process 304 as described herein.

FIGS. 3A-3D illustrate an article 310 having a surface. Article 310 may represent a body of a semiconductor process chamber component, including but not limited to, a body of a heater, susceptor and/or all surfaces of a heater assembly or a susceptor assembly within a processing chamber. The article 310 may be formed of a graphite composite coated with SiC, TaC or a combination of SiC/TaC, a ceramic dielectric material, such as AlN, a metal-ceramic composite (e.g., $Al_2O_3/SiO_2$, $Al_2O_3/MgO/SiO_2$, SiC, $Si_3N_4$, $AlN/SiO_2$ and the like), a metal (such as aluminum, stainless steel) or other suitable materials, and may further comprise materials such as $Al_2O_3$, $SiO_2$, and so on.

For ALD processes, either adsorption of a precursor onto a surface or a reaction of a reactant with the adsorbed precursor may be referred to as a "half-reaction." During a first half reaction, a precursor is pulsed onto a surface of the article 310 for a period of time sufficient to allow the precursor to fully adsorb onto the surface. The adsorption is self-limiting as the precursor will adsorb onto a finite number of available sites on the surface, forming a uniform continuous adsorption layer on the surface. Any sites that have already adsorbed with a precursor will become unavailable for further adsorption with the same precursor unless and/or until the adsorbed sites are subjected to a treatment that will form new available sites on the uniform continuous coating. Exemplary treatments may be plasma treatment, treatment by exposing the uniform continuous adsorption layer to radicals, or introduction of a different precursor able to react with the most recent uniform continuous layer adsorbed to the surface.

A typical reaction cycle of an ALD process starts with a precursor (i.e., a chemical A) flooded into an ALD chamber and adsorbed onto surfaces of the article (including surfaces of holes and features within the articles). The excess precursor may then be flushed out of the ALD chamber before a reactant (i.e., a chemical R) is introduced into the ALD chamber and subsequently flushed out. For ALD, the final thickness of material is dependent on the number of reaction cycles that are run, because each reaction cycle will grow a layer of a certain thickness that may be one atomic layer or a fraction of an atomic layer.

Aside from being a conformal process, ALD is also a uniform process and is capable of forming very thin films, for example, having a thickness of about 3 nm or more. All exposed surfaces of the article will have the same or approximately the same amount of material deposited. The ALD technique can deposit a thin layer of material at a relatively low temperature (e.g., about 25° C. to about 350° C.) so that it does not damage or deform any materials of the component. Additionally, the ALD technique, can also deposit a layer of material within complex features (e.g., high aspect ratio features) of the component. Furthermore, the ALD technique generally produces relatively thin (i.e., 20 µm or less) coatings that are porosity-free (i.e., pin-hole free), which may eliminate crack formation during deposition.

The rare earth metal containing silicate coating may be grown or deposited using ALD with a rare earth metal-containing precursor, a silicon containing precursor and a reactant containing oxygen, for example, oxygen gas ($O_2$), water vapor ($H_2O$), ozone ($O_3$), oxygen radicals ($O^*$) or other oxygen-containing material. The rare earth metal-containing precursor may contain yttrium, erbium, tantalum, iridium, rhodium, lanthanum, lutetium, scandium, gadolinium, samarium, dysprosium, etc. The silicon containing precursor may be, for example, silane, tris(tert-butoxy) silanol, etc. In some embodiments, a mixture of two precursors is introduced together, where the mixture includes a first percentage of a silicon precursor and a second percentage of a rare earth metal-containing precursor. The mixture may include a ratio of yttrium precursor to silicon precursor that is suitable to form a target type of silicate. For example, if the target silicate is $Y_2SiO_5$, then there may be an approximately 2:1 ratio of the yttrium precursor to silicon precursor. If the target silicate is $Y_2Si_2O_7$, then there may be an approximately 1:1 ratio of the yttrium precursor to silicon precursor. In some embodiments, the rare earth metal containing precursor is a yttrium containing precursor, for example, tris(N,N-bis(trimethylsilyl)amide)yttrium (III), yttrium (III)butoxide, tris(cyclopentadienyl)yttrium(III), or Y(thd)3 (thd=2,2,6,6-tetramethyl-3,5-heptanedionato). In an alternative embodiment, rather than a mixture of a separate silicon precursor and rare earth precursor, a single precursor for a rare earth silicate may be used.

Referring to FIG. 3A, article 310 may be introduced to a mixture of a first precursor 360 of a rare earth material and a second precursor 362 of silicon for a first duration until a surface of article 310 is fully adsorbed with the first precursor 360 and the second precursor 362 to form an adsorption layer 314. The first precursor 360 may be a rare earth precursor (e.g., a yttrium precursor, an erbium precursor, and so on). The second precursor 362 may be a silicon precursor such as silane, dichlorosilane, 2,4,6,8-tetramethylcyclotetrasiloxane, dimethoxydimethylsilane, disilane, methylsilane, octamethylcyclotetrasiloxane, tris(isopropoxy)silanol, tris(tert-butoxy)silanol, tris(tert-pentoxy)silanol and so on. Alternatively, a single precursor for a rare earth silicate may be used. Subsequently, article 310 may be introduced to a first reactant 365 to react with the adsorption layer 314 to grow a solid layer 316 (e.g., so that the layer 316 is fully grown or deposited, where the terms "grown" and "deposited" may be used interchangeably herein). For a single layer rare earth metal containing silicate coating, the first precursor 360 may be a precursor for a rare earth metal-containing material such as a rare earth monosilicate and/or a rare earth disilicate. The first reactant 365 may be oxygen, water vapor, ozone, oxygen radicals, or other oxygen source. ALD is thus used to form the layer 316. Layer 316 may be a single-layer rare earth metal containing silicate coating, for example, a rare earth monosilicate (e.g., $Y_2SiO_5$) or a rare earth disilicate (e.g., $Y_2Si_2O_7$). Whether the layer 316 is a monosilicate, a disilicate, or mixture thereof may depend on a ratio of the yttrium precursor to the silicon precursor.

The rare earth metal containing silicate coating (e.g., Layer 316 or the resulting coating after deposition) is uniform, continuous and conformal. The coating is porosity free (e.g., have a porosity of zero) or have an approximately zero porosity in embodiments (e.g., a porosity of 0% to 0.01%). Layer 316 may have a thickness of less than one atomic layer to a few atoms in some embodiments after a single ALD deposition cycle. Some metalorganic precursor molecules are large. After reacting with the reactant 365, large organic ligands may be gone, leaving much smaller metal atoms. One full ALD cycle (e.g., that includes introduction of precursors 360 followed by introduction of reactants 365) may result in the formation of a layer with an average thickness less than a single unit cell.

Multiple full ALD deposition cycles may be implemented to deposit a thicker layer 316, with each full cycle (e.g., including introducing precursor 360, flushing, introducing reactant 365, and again flushing) adding to the thickness by an additional fraction of an atom to a few atoms. As shown, up ton full cycles may be performed to grow the layer 316, where n is an integer value greater than 1. In some embodiments, a rare earth metal disilicate layer can be grown on article 310 as layer 316 via a full cycle or sequence of cycles, and then, after purging the deposition chamber, another full deposition cycle or sequence of deposition cycles can be used to grow a rare earth metal monosilicate layer on top of the rare earth disilicate layer. Alternatively, layer 316 can be a rare earth monosilicate layer and a rare earth disilicate layer can be grown on top of the rare earth monosilicate layer.

In some embodiments, a similar ALD process to that described with reference to FIG. 3A may be performed to deposit a buffer layer prior to deposition of a rare earth metal containing silicate coating. The buffer layer may by $SiO_2$, Si, SiC, $Si_xC_yO_z$, $Si_xO_yN_z$, $Si_xC_yN_z$, $Si_3N_4$ or other Si containing material. For example, a silicon precursor may be used to deposit Si followed by an oxygen source reactant to form an $SiO_2$ buffer layer.

In some embodiments, a similar ALD process to that described with reference to FIG. 3A may be performed to deposit a rare earth oxide layer over the rare earth metal containing silicate coating. For example, a yttrium precursor may be used to deposit yttrium followed by an oxygen source reactant to form a $Y_2O_3$ coating over the rare earth metal containing silicate coating. The rare earth metal containing silicate coating with a top rare earth oxide layer provides robust plasma resistance and mechanical properties without significantly impacting the thermal and electrical properties of the article (e.g., susceptor or heater). The coating may protect the article from erosion, provide resistance to oxidation and may maintain adhesion even at high temperatures.

Figure 3B:
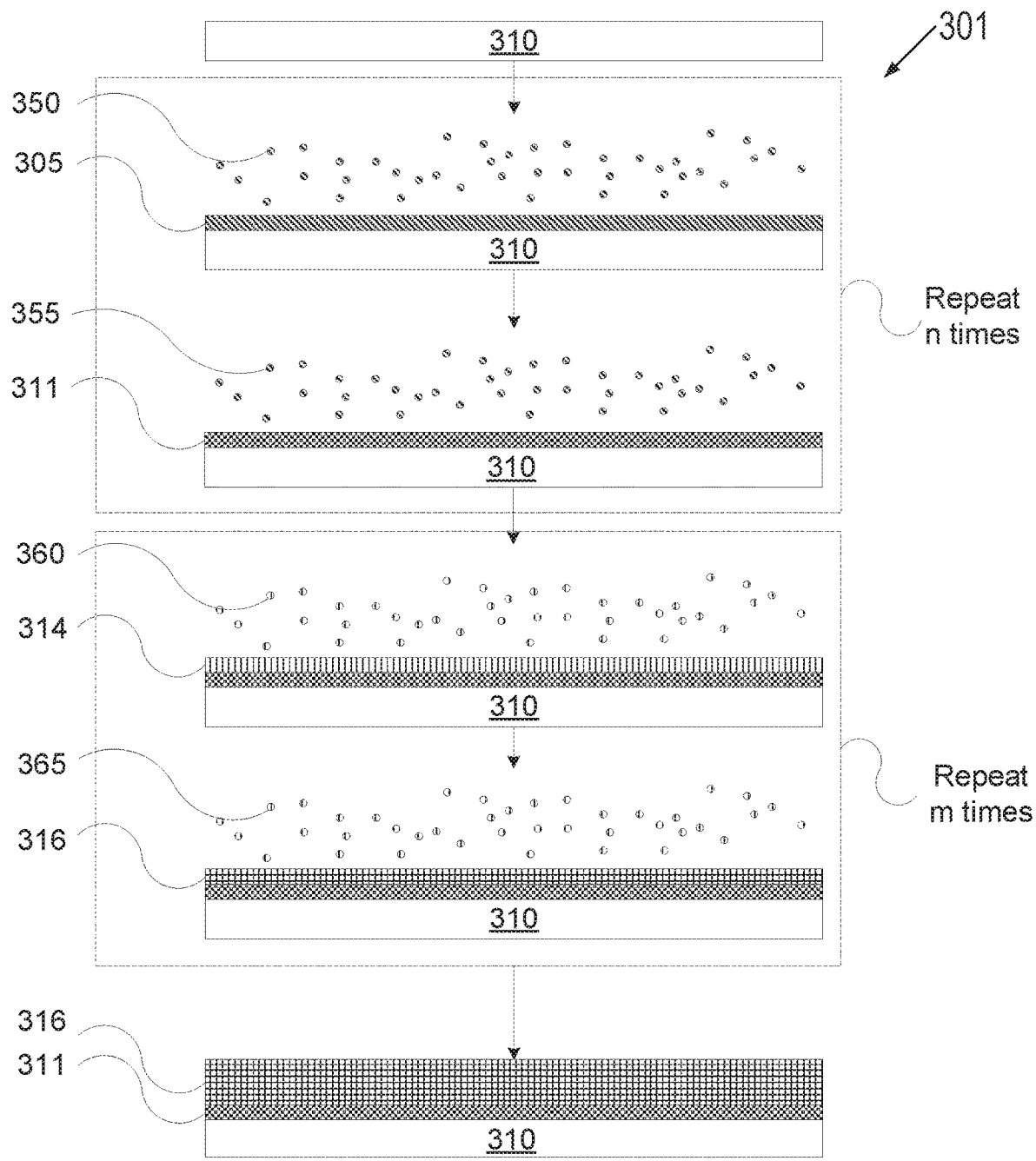
FIG. 3B depicts another embodiment of a deposition process in accordance with an atomic layer deposition technique as described herein.

FIG. 3B describes a deposition process 301 that includes deposition of an optional buffer layer 310 followed by deposition of layer 316 as described with reference to FIG. 3A. The buffer layer 310 may have the same or a similar material to the underlying material of the article. For example, the buffer layer may be formed of a $Si_xO_y$ material (e.g., $SiO_2$) or other silicon-containing material with or without an amorphous structure.

Referring to FIG. 3B, article 310 may be introduced to a first precursor 350 for a first duration until a surface of article 310 is fully adsorbed with the first precursor 350 to form an adsorption layer 305. Subsequently, article 310 may be introduced to a first reactant 355 to react with the adsorption layer 305 to grow a solid layer 311. The first precursor 350 may be a silicon containing precursor such as silane, dichlorosilane, 2,4,6,8-tetramethylcyclotetrasiloxane, dimethoxydimethylsilane, disilane, methyl silane, octamethylcyclotetrasiloxane, tris(isopropoxy)silanol, tris(tert-butoxy)silanol, tris(tert-pentoxy)silanol . The first reactant 355 may be oxygen, water vapor, ozone, oxygen radicals, or other oxygen source. Layer 311 thus, forms a buffer layer between the article and the rare earth metal containing silicate coating. Layer 316 may then be grown on the buffer layer 311 by repeating the process and as described with respect to FIG. 3A.

The thickness of the buffer layer 311 may be about 1 nm to about 50 nm, or about 2 nm to about 25 nm, or about 5 nm to about 10 nm. In certain embodiments, the thickness of the buffer layer is about 1 nm, or about 5 nm, or about 10 nm, or about 15 nm. The thickness of the rare earth metal-containing layer prepared by ALD may be about 3 nm to about 20 µm, or about 25 nm to about 5 µm, or about 50 nm to about 500 nm, or about 75 nm to about 200 nm. In some embodiments, the thickness of the single-layer rare earth metal containing silicate coating may be about 50 nm, or about 75 nm, or about 100 nm, or about 125 nm, or about 150 nm, or about 200 nm, or about 300 nm. In certain embodiments, the total thickness of the rare earth metal containing silicate coating including the buffer layer and the rare earth metal-containing layer may be about 50 nm, or about 100 nm, or about 500 nm, or about 5 µm, or about 20 µm.

Figure 3C:
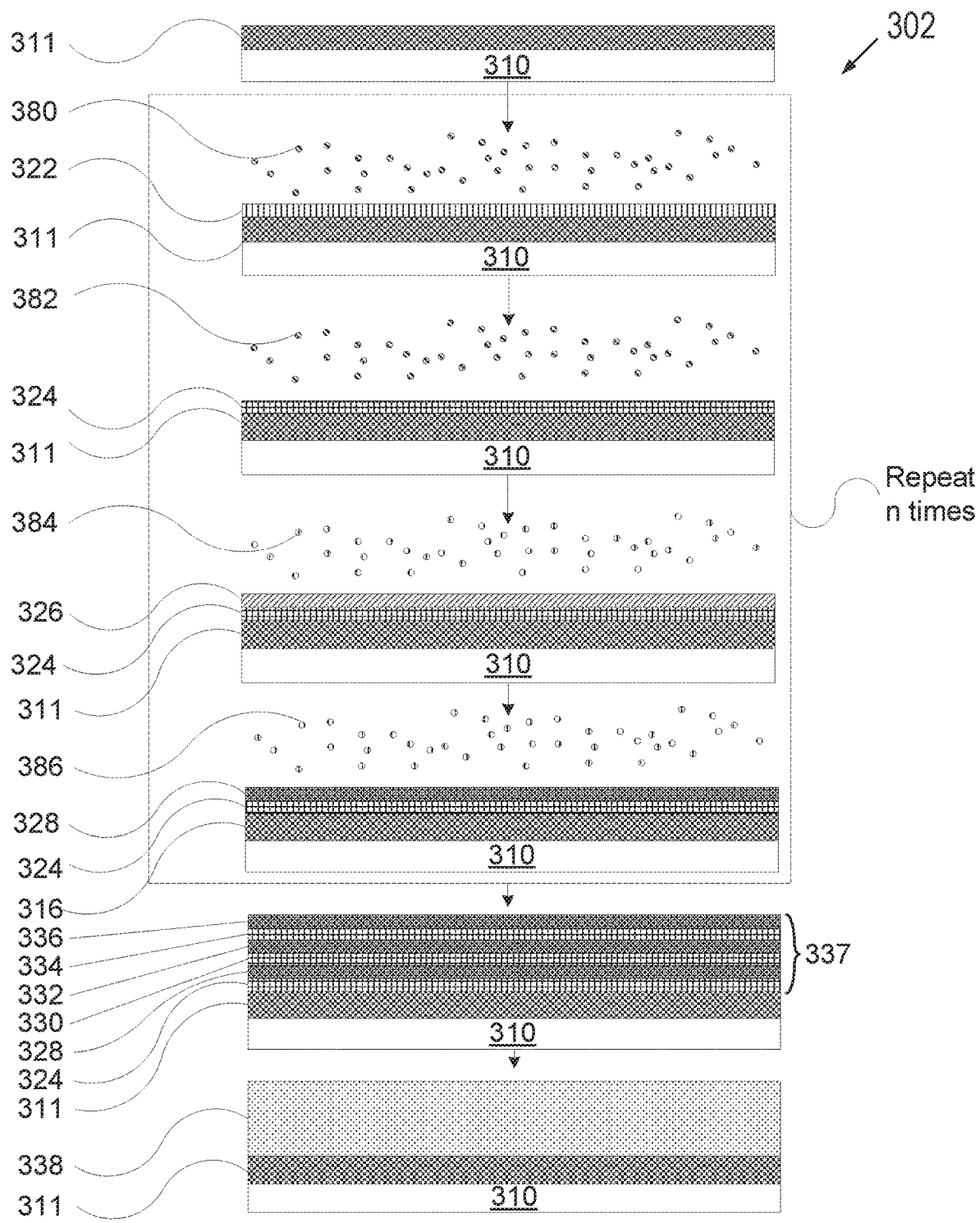
FIG. 3C depicts another embodiment of a deposition process in accordance with an atomic layer deposition technique as described herein.
Figure 3D:
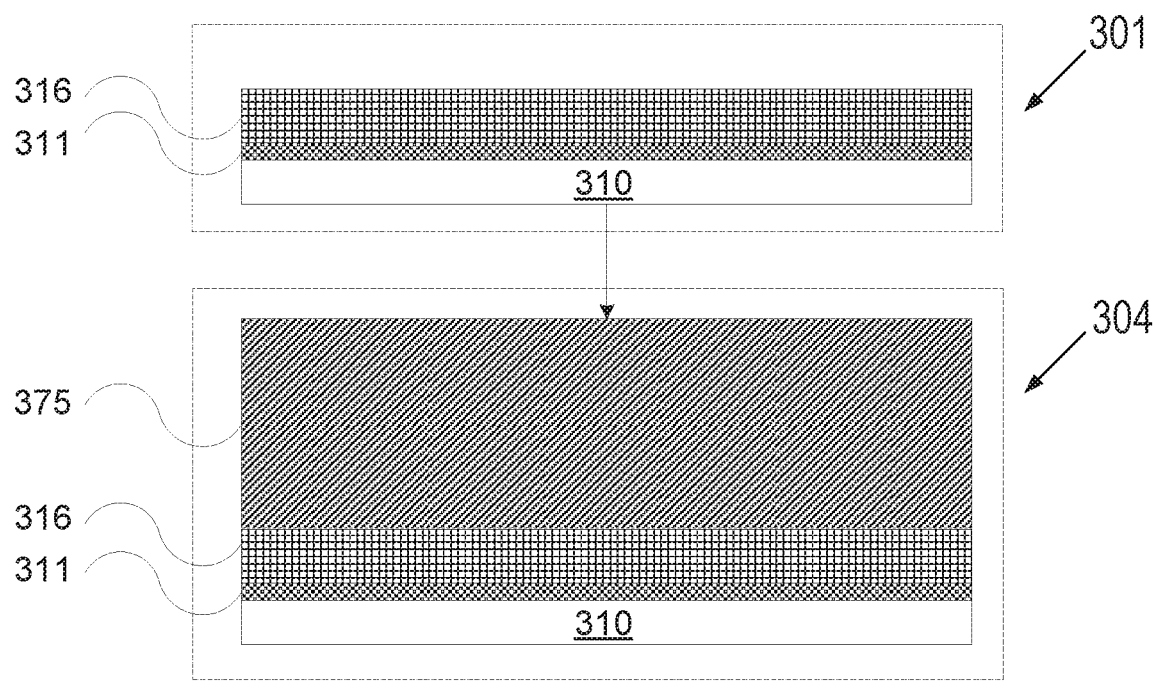
FIG. 3D depicts another embodiment of a deposition process in accordance with a combination of a physical vapor deposition over atomic layer deposition technique as described herein.

With reference to FIG. 3C, in some embodiments, a multi-layer stack may be deposited on the article 310 using ALD. Article 310 having optional buffer layer 311 may be inserted into a deposition chamber. Optional buffer layer 311 may be formed as set forth with reference to FIG. 3A or FIG. 3B. To form the multi-layer stack, article 310 may be introduced to one or more precursors 380 containing one or more rare earth metal-containing materials for a duration until layer 311 is fully adsorbed with the one or more precursors 380 to form layer 322. Subsequently, article 310 may be introduced to a reactant 382 to react with layer 322 to grow layer 324. Accordingly, a rare earth metal containing oxide layer 324 may be fully grown or deposited over layer 311 using ALD. In an example, precursor 380 may be a yttrium containing precursor used in the first half cycle, and reactant 382 may be $H_2O$ used in the second half cycle. The rare earth metal-containing layer 324 may be, for example, $Y_2O_3$ or $Er_2O_3$. The deposition cycle including the introduction of the precursors 380 followed by the introduction of the reactant 382 may be performed up to x times, where x is an integer with a value of 1-10 in embodiments.

Article 310 having layer 311 and layer 324 may be introduced to one or more precursors 384 for a duration until layer 324 is fully adsorbed with the one or more precursors 384 to form layer 326. Subsequently, article 310 may be introduced to a reactant 386 to react with layer 326 to grow an additional layer 328. Accordingly, the additional layer 328 is fully grown or deposited over layer 324 using ALD. In an example, precursor 384 may be a silicon precursor such as silane or tris(tert-butoxy)silanol used in the first half cycle, and reactant 386 may be $H_2O$ or another oxygen source used in the second half cycle. The layer 328 may be a silicon dioxide or other $SiO_x$ layer in embodiments.

The deposition cycle including the introduction of the precursors 384 followed by the introduction of the reactant 386 may be performed up to y times, where y is an integer with a value of 1-10 in embodiments. As shown, the deposition of layer 324 and layer 328 may be repeated n times to form a stack 337 of alternating layers, where n is an integer value of 1 or more (e.g., greater than 2 in some embodiments). N may represent a finite number of layers selected based on the targeted thickness and properties. The stack 337 of alternating layers may be considered as a rare-earth metal-containing layer containing multiple alternating sublayers. Accordingly, precursors 380, reactants 382, precursors 384 and reactants 386 may be repeatedly introduced sequentially to grow or deposit additional alternating layers 330, 332, 334, 336, and so on. Each of the layers 324, 328, 330, 332, 334, 336, and so on may be very thin layers having an average thickness of less than a single atomic layer to a few atomic layers. Alternatively, one or more of the layers 324, 328, 330, 332, 334, 336 may have a thickness of up to 1-2 nm in some embodiments. In a further embodiment, one or more of the layers 324, 328, 330, 332, 334, 336 may have a thickness of up to about 5 μm.

The alternating layers 324-336 described above may have a 1:1 ratio, wherein for each layer of one material there is one layer of another material. However, in other embodiments there may be other ratios such as 2:1, 3:1, 3:2, 4:1, 1:4, 2:3, 1:3, 1:2, and so on between the different types of layers. For example, two $Y_2O_3$ layers may be deposited for every $SiO_2$ layer in an embodiment. Additionally, the stack 337 of alternating layers 324-336 has been described as an alternating series of two types of metal layers. However, in other embodiments more than two types of metal layers may be deposited in an alternating stack 337. For example, the stack 337 may include three different alternating layers (e.g., a first layer of $Y_2O_3$, a first layer of $SiO_2$, a first layer of $ZrO_2$, a second layer of $Y_2O_3$, a second layer of $SiO_2$, a second layer of $ZrO_2$, and so on).

After the stack 337 of alternating layers has been formed, an anneal process may be performed to cause the alternating layers of different materials to diffuse into one another and form a complex silicate having a single phase or multiple phases. After the annealing process, the stack of alternating layers 337 may therefore become a single rare-earth metal-containing silicate layer 338. For example, if the layers in the stack are $Y_2O_3$ and $SiO_2$, then the resulting rare-earth metal-containing oxide layer 338 may consist of a $Y_2SiO_5$ phase and/or a $Y_2Si_2O_7$ phase.

The ratio of the thickness of the layers 324 to the thickness of the layers 328 (and ratio of the number of times x that deposition cycles are performed to the number of times y that deposition cycles are performed) may control a composition of the rare earth metal containing silicate coating in embodiments. For example, a thickness ratio of 2:1 of $Y_2O_3$ layers to $SiO_2$ layers may result in a $Y_2SiO_5$ phase, while a thickness ratio of 1:1 of $Y_2O_3$ layers to $SiO_2$ layers may result in a $Y_2Si_2O_7$ phase.

Each layer of the rare earth metal-containing material may have a thickness of about 5-10 angstroms and may be formed by performing about 1 to about 10 cycles of an ALD process, where each cycle forms a nanolayer (or slightly less or more than a nanolayer) of the rare earth metal-containing material. In one embodiment, each layer of the rare earth metal containing silicate coating is formed using about 6 to about 8 ALD cycles. Each SiO2 layer may be formed from about 1 to about 2 ALD cycles (or a few ALD cycles) and may have a thickness of less than an atom to a few atoms. The stack 337 of alternating layers may have a total thickness of about 3 nm to about 20 μm.

In some of the embodiments described with reference to FIGS. 3A-3C, the surface reactions (e.g., half-reactions) are done sequentially, and the various precursors and reactants are not in contact in embodiments. Prior to introduction of a new precursor or reactant, the chamber in which the ALD process takes place may be purged with an inert carrier gas (such as nitrogen or air) to remove any unreacted precursor and/or surface-precursor reaction byproducts. In some embodiments, at least two precursors are used concurrently (e.g., as described with reference to FIG. 3A), in other embodiments at least three precursors are used and in yet further embodiments at least four precursors are used.

ALD processes may be conducted at various temperatures depending on the type of process. The optimal temperature range for a particular ALD process is referred to as the "ALD temperature window." Temperatures below the ALD temperature window may result in poor growth rates and non-ALD type deposition. Temperatures above the ALD temperature window may result in reactions taken place via a chemical vapor deposition (CVD) mechanism. The ALD temperature window may range from about 100° C. to about 650° C. In some embodiments, the ALD temperature window is from about 20° C. to about 300° C., or about 25° C. to about 250° C., or about 100° C. to about 200° C., or about 50° C. to 150° C. , or about 20° C. to 125° C.

The ALD process allows for a conformal rare earth metal containing silicate coating having uniform thickness on articles and surfaces having complex geometric shapes, holes with high aspect ratios (e.g., pores), and three-dimensional structures. Sufficient exposure time of each precursor to the surface enables the precursor to disperse and fully react with the surfaces in their entirety, including all of its three-dimensional complex features. The exposure time utilized to obtain conformal ALD in high aspect ratio structures is proportionate to the square of the aspect ratio and can be predicted using modeling techniques. Additionally, the ALD technique is advantageous over other commonly used coating techniques because it allows in-situ on demand material synthesis of a particular composition or formulation without a lengthy and difficult fabrication of source materials (such as powder feedstock and sintered targets).

Any of the ALD processes 300, 301, 302 may be performed multiple times to form a multi-layer rare earth metal containing silicate coating comprising at least a first layer and a second layer. The first layer may be a first type of rare earth silicate and the second layer may be a second type of rare earth silicate. For example, the first layer may be a rare earth disilicate and the second layer may be a rare earth monosilicate. In another example, the first layer may include a first ratio of a rare earth monosilicate and a rare earth disilicate and the second layer may include a second ratio of the rare earth monosilicate and the rare earth disilicate. For example, the first layer may include a rare earth metal monosilicate and a rare earth metal disilicate at a first volume ratio (monosilicate:disilicate) of about 1:20 to about 20:1, and the second layer may include the rare earth metal monosilicate and the rare earth metal disilicate at a volume ratio (monosilicate:disilicate) of about 1:10 to about 10:1.

According to embodiments herein, as shown in FIG. 3D, a hybrid formation of the rare earth metal containing silicate coating on the article by at least one non-line-of-sight deposition approach and at least one line-of-sight deposition approach may be employed. Such rare earth metal containing silicate coatings formed by this hybrid process can deposit a thick coating on the article or a body of the article, which can provide a long service life of the article or a body of the article.

A non-line-of-sight deposition approach, such as ALD, can deposit a conformal coating over the entire surface of the article (e.g., including high aspect ratio features such as holes and gas lines), but the thickness of such coatings are usually limited to less than about 25 µm. A line-of-sight deposition approach, such as PVD and PEPVD, can deposit relatively thick coatings, for example, up to about 500 µm, or up to about 250 µm, or from about 5 µm to about 250 µm, or from about 5 µm to about 500 µm, or even greater than about 500 µm, but such coatings would not conformally cover the surface of the article or a body of the article (e.g., would not be able to reach the surface of high aspect ratio features such as holes and gas lines).

The combination of a non-line-of-sight deposition approach with a line-of-sight deposition approach can provide conformal coverage of the article's entire surface, thereby protecting the article from corrosion in the working environment (e.g., by corrosive gas, thermal oxidation, etc.), and a thick plasma resistant coating to further protect the article and its surfaces from aggressive process gases or plasma erosion, such as in plasma etch chambers.

FIG. 3D describes the deposition of a conformal rare earth metal containing silicate coating on an article using a hybrid process, for example, involving an ALD process 301 as described with reference to FIG. 3B, and a line-of-sight process 304 such as PVD, PEPVD, etc. According to certain embodiments, a coating 375, which can be a rare earth metal silicate coating or a rare earth metal oxide coating, can be formed over the conformal ALD coating 316 using PVD, PEPVD, etc. Coating 375 may have a thickness of about 3 nm to about 250 µm, or about 5 nm to 100 µm, or about 5 nm to 50 µm, or about 25 nm to 50 µm, or about 50 nm to 10 µm, or about 50 nm to 5µm, or about 50 nm to 1 µm, or about 50 nm to about 500 nm, or about 75 nm to about 200 nm. In some embodiments, the materials used to form coating 375 may be the same as the materials used to form coating 316. In other embodiments, the materials may be different, for example, coating 375 may be a rare earth metal oxide. In addition, coatings formed by a line-of-sight approach can be single layer or multi-layer (e.g., with one or more rare earth metal containing silicates or oxide materials).

In other embodiments, the formation of a thick rare earth metal containing silicate or oxide layer can first be formed on a particular surface area of the article (e.g., a body of the article) by a line-of-sight deposition approach. Subsequently, a conformal rare earth metal containing coating is formed over the entire surface (including the coated portion) of the article surface by a non-line-of-sight deposition approach.

Figure 4A:
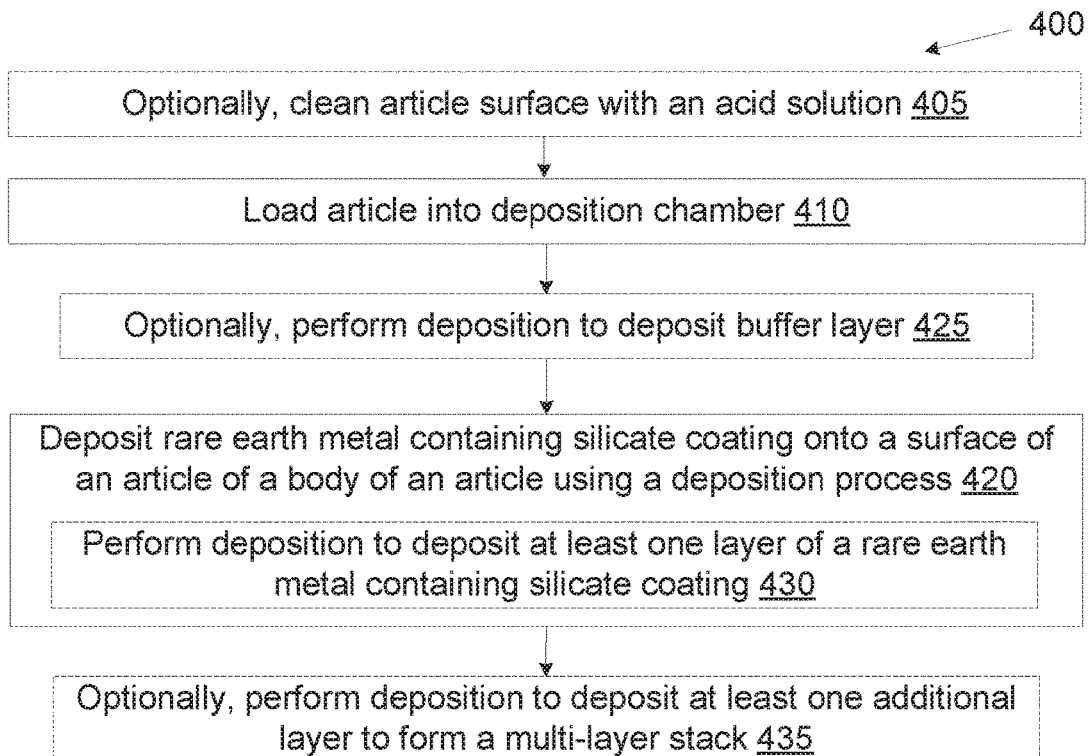
FIG. 4A illustrates a method for creating a plasma resistant coating using atomic layer deposition as described herein.

FIG. 4A illustrates a method 400 for forming a rare earth metal containing silicate coating on an article (e.g., a susceptor or a heater) or a body of an article according to embodiments. Method 400 may be used to coat any articles described herein. The method may optionally begin by selecting a composition for the rare earth metal containing silicate coating.

The composition selection and method of forming may be performed by the same entity or by multiple entities.

The method may optionally include, at block 405, cleaning the article with an acid solution. In one embodiment, the article is bathed in a bath of the acid solution. The acid solution may be a hydrofluoric acid (HF) solution, a hydrochloric acid (HCl) solution, a nitric acid ($HNO_3$) solution, or combination thereof in embodiments.

At block 410, the article is loaded into a deposition chamber. Optionally, at block 425, a deposition process is performed to deposit a buffer layer such as a $Si_xO_y$ (e.g., $SiO_2$) layer on the article. At block 420, the method comprises depositing a rare earth metal containing silicate coating onto a surface of the article using at least one of a chemical vapor deposition (CVD), plasma enhanced chemical vapor deposition (PECVD), physical vapor deposition (PVD), plasma enhanced physical vapor deposition (PEPVD), or atomic layer deposition (ALD) or combinations thereof. At block 430, a deposition process is performed to deposit at least one layer of a rare earth metal containing silicate coating. The at least one layer may be, for example, a rare earth metal monosilicate, a rare earth metal disilicate or a rare earth metal oxide.

In one embodiment, optionally, at block 435, another deposition process (or cycle) is performed to deposit at least one additional layer of the rare earth metal containing silicate coating. The at least one additional layer may be, for example, a rare earth metal monosilicate, a rare earth metal disilicate or a rare earth metal oxide.

In one embodiment, the method includes forming a buffer layer on a surface of a body, and forming a multi-layer stack on the buffer layer including alternately depositing layers of a rare earth metal monosilicate and a rare earth metal disilicate on the buffer layer, wherein the rare earth metal of the monosilicate and the disilicate is independently selected from a group consisting of yttrium, erbium, tantalum, iridium, rhodium, lanthanum, lutetium, scandium, gadolinium, samarium and dysprosium. In some embodiments, a rare earth metal monosilicate is the final (surface) layer deposited on the body of the article. In other embodiments, the final (surface) layer deposited on the body of the article is a rare earth metal containing oxide selected from yttrium oxide ($Y_2O_3$), erbium oxide ($Er_2O_3$), tantalum oxide ($Ta_2O_5$), iridium ($Ir_2O_3$), rhodium ($Rh_2O_3$), lanthanum oxide ($La_2O_3$), lutetium oxide ($Lu_2O_3$), scandium oxide ($Sc_2O_3$), gadolinium oxide ($Gd_2O_3$), samarium oxide ($Sm_2O_3$) dysprosium oxide ($Dy_2O_3$) and combinations thereof.

In further embodiments, the method includes forming a plasma resistant heater or susceptor including performing at least an atomic layer deposition process to deposit a rare earth metal containing silicate coating on a surface of the heater or susceptor, wherein the heater comprises aluminum nitride or wherein the susceptor comprises graphite coated with silicon carbide, tantalum carbide or a combination thereof, wherein the rare earth metal containing silicate coating has a thickness of about 3 nm to about 250 µm, and wherein the rare earth metal containing silicate coating comprises a material selected from a group consisting of yttrium monosilicate ($Y_2SiO_5$), yttrium disilicate ($Y_2Si_2O_7$), erbium monosilicate ($Er_2SiO_5$), erbium disilicate ($Er_2Si_2O_7$), tantalum monosilicate ($Ta_2SiO_5$), tantalum disilicate ($Ta_2Si_2O_7$), iridium monosilicate ($Ir_2SiO_5$), iridium disilicate ($Ir_2Si_2O_7$), rhodium monosilicate ($Rh_2Si_2O_7$), rhodium disilicate ($Rh_2SiO_5$), lanthanum monosilicate ($La_2SiO_5$), lanthanum disilicate ($La_2Si_2O_7$), lutetium monosilicate ($Lu_2SiO_5$), lutetium disilicate ($Lu_2Si_2O_7$), scandium monosilicate ($Sc_2SiO_5$), scandium disilicate ($Sc_2Si_2O_7$), gadolinium monosilicate ($Gd_2SiO_5$), gadolinium disilicate ($Gd_2Si_2O_7$), samarium monosilicate ($Sm_2SiO_5$), samarium disilicate ($Sm_2Si_2O_7$), dysprosium monosilicate ($Dy_2SiO_5$), dysprosium disilicate ($Dy_2Si_2O_7$) and combinations thereof.

Figure 4B:
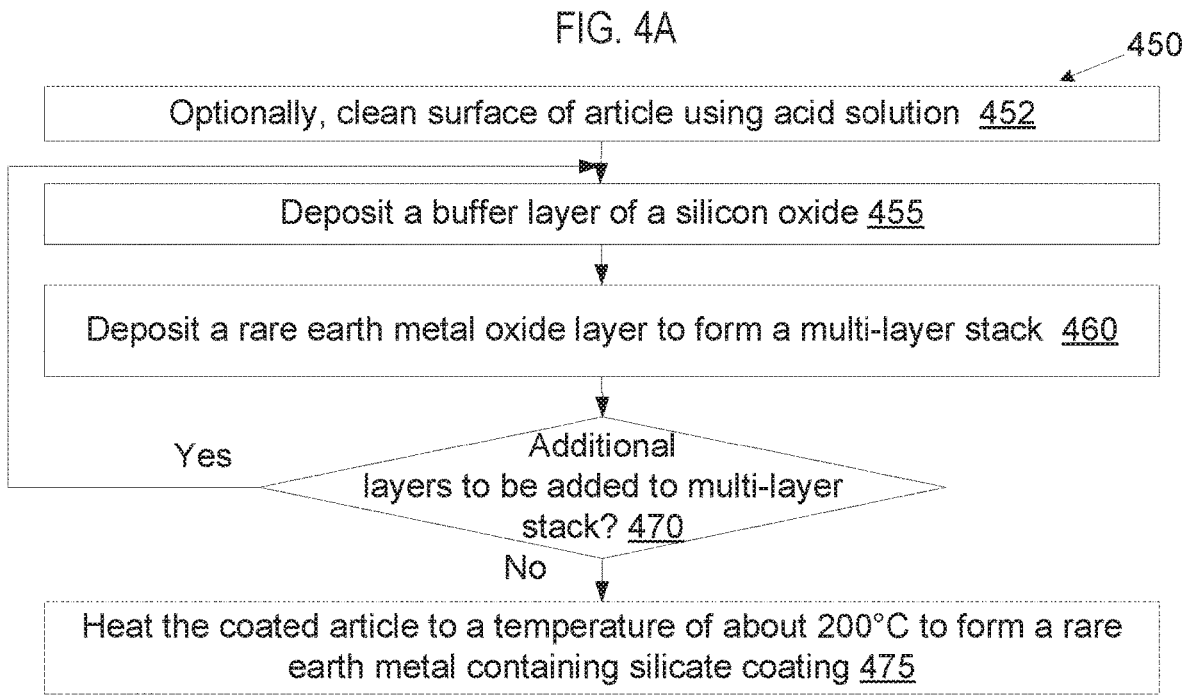
FIG. 4B illustrates a method for creating a plasma resistant coating using atomic layer deposition as described herein.

FIG. 4B illustrates a method 450 for forming a rare earth metal containing silicate coating on an article (e.g., a susceptor or a heater) or a body of an article according to an embodiment. The method may optionally begin by selecting compositions for the rare earth metal containing silicate coating. The composition selection and method of forming may be performed by the same entity or by multiple entities.

At block 452 of method 450, a surface of the article optionally may be cleaned using an acid solution. The acid solution may be any of the acid solutions described above with reference to block 405 of method 400. The article may then be loaded into a deposition chamber.

Pursuant to block 455, the method includes depositing a buffer layer (e.g., $SiO_2$) onto at least one surface of the article via CVD, PECVD, PVD, PEPVD, ALD or combinations thereof. The buffer layer may have a thickness of about 5 nm to about 300 nm. Pursuant to block 460, the method further includes depositing a rare earth metal containing oxide layer (e.g., $Y_2O_3$) on the buffer layer also via CVD, PECVD, PVD, PEPVD, ALD or a combination thereof. The rare-earth metal containing oxide layer may include a mixture of multiple different rare earth metal oxides, for example, $Y_2O_3$ and $Er_2O_3$.

At block 470, a determination may be made as to whether additional layers are to be added (e.g., if a multi-layer stack is to be formed). If additional layers are to be added, then the method may return to block 455 and an additional layer of $Si_xO_y$ may be formed. Otherwise the method may proceed to block 475.

At block 475, the article (e.g., the susceptor or heater) and the deposited layers from blocks 455, 460 and 470 are heated. The heating may be via an annealing process, a thermal cycling process and/or via a manufacturing step during semiconductor processing. In one embodiment, thermal cycling process is performed on coupons as a check after manufacture to detect cracks for quality control, where the coupons are cycled to the highest temperature that a part may experience during processing. The thermal cycling temperature depends on a specific application or applications that the part will be used for. The temperature may be selected based on the material of construction of the article, surface, and film layers so as to maintain their integrity and refrain from deforming, decomposing, or melting any or all of these components.

According to embodiments, when forming a yttrium monosilicate and/or a yttrium disilicate from a multilayer stack containing layers of a rare earth metal containing oxide (e.g., $Y_2O_3$) and a silicon oxide (e.g., $SiO_2$), the ratio of the number of rare earth metal containing oxide deposition cycles to the number of silicon oxide deposition cycles will affect the amount of yttrium monosilicates and disilicates in the final coating (e.g., a solid solution containing multiple phases). For example, a 2:1 ratio of the number of $Y_2O_3$ to the number of $SiO_2$ deposition cycles will result in $Y_2SiO_5$.

Yttrium containing precursors useful in the methods disclose herein include, but are not limited to, tris(N,N-bis (trimethylsilyl)amide)yttrium (III) and yttrium (III)butoxide precursor. In some embodiments, two different rare earth metal containing precursors (e.g., a yttrium containing precursor and a silicon containing precursor) can be co-deposited onto the article or the body of the article. For example, the two precursors may be introduced into the process chamber together or sequentially before the reactant is introduced.

The rare earth metal containing silicate coatings described herein resist thermal oxidation and erosion at temperatures of about 25° C. to about 1,500° C. The resistance of the rare earth metal containing silicate coating to plasma can be measured through "erosion rate" (ER), which may have units of micron/hour (µm/hr) or Angstrom/hour (Å/hr), throughout the duration of the coated components' operation and exposure to plasma. Measurements may be taken after different processing times and/or temperatures. For example, measurements may be taken before processing, or at about 50 processing hours, or at about 150 processing hours, or at about 200 processing hours, and so on. Variations in the composition of the rare earth metal containing silicate coating grown or deposited on the heater support and/or other components may result in multiple different plasma resistances or erosion rate values. Additionally, a rare earth metal containing silicate coating with a single composition exposed to various plasmas could have multiple different plasma resistances or erosion rate values. For example, a plasma resistant material may have a first plasma resistance or erosion rate associated with a first type of plasma and a second plasma resistance or erosion rate associated with a second type of plasma.

EXAMPLES

Example 1—Deposition of $Y_xSi_yO_z$ Coatings on a Substrate Using ALD

Yttrium silicate ($Y_xSi_yO_z$) coatings were deposited onto substrates (i.e., silicon wafers) using ALD according to embodiments described herein. The yttrium containing precursor used to form the coatings was $(MeCp)_3Y+H_2O$ and the silicon containing precursor was bis(tertiary-butylamino)silane (BTBAS)+$O_3$. The resulting thickness of the rare earth metal containing coatings was 100 nm. Each resultant coating was a single layer $Y_xSi_yO_z$ coating containing $Y_2Si_2O_7$ or $Y_2SiO_5$. A Transmission Electron Microscopy (TEM) spectrum showed that the composition distribution of the 100 nm $Y_2Si_2O_7$ coating contained oxygen (O) at an atomic concentration of about 65%, yttrium (Y) at an atomic concentration of about 20% and silicon (Si) at an atomic concentration of about 18%. A TEM spectrum showed that the composition distribution of the 100 nm $Y_2SiO_5$ coating contained oxygen (O) at an atomic concentration of about 62%, yttrium (Y) at an atomic concentration of about 30% and silicon (Si) at an atomic concentration of about 10%. The coatings conformally coated the silicon wafer substrates. A 500 nm $Y_2Si_2O_7$ coating was also deposited using ALD on silicon carbide (SiC) formed by chemical vapor deposition. The 500 nm $Y_2Si_2O_7$ coating conformally covered the SiC layer.

Additionally, a 5 µm $Y_2Si_2O_7$ coating was deposited using ion assisted deposition (IAD) on an alumina ($Al_2O_3$) ceramic substrate. The 5 µm $Y_2Si_2O_7$ coating adhered to the alumina ceramic substrate.

Another 100 nm $Y_2Si_2O_7$ coating was deposited by ALD onto an uneven SiC layer that was deposited by CVD. The coating had very good coverage and adhesion to the uneven SiC layer and no cracks or defects were observed on the coating body and/or interfacial area.

A nine (9) µm amorphous $YF_3$ coating was deposited by IAD over a 500 nm $Y_2Si_2O_7$ deposited by ALD on an Al6061 substrate. The coating had good coverage and adhesion to the yttrium silicate layer and no cracks or defects were observed on the coating body and/or interfacial area.

Example 2—Temperature Resistance of $Y_2SiO_5$ Coatings

Three samples were prepared: 1) $Y_2SiO_5$ was deposited by ALD on a SiC layer deposited by CVD; 2) $Y_2SiO_5$ was deposited by ALD on an $Al_2O_3$ substrate; and $Y_2SiO_5$ was deposited by ALD on a silicon wafer. The samples were exposed to a heat treatment process including a ramp up to 350° C. where the temperature was maintained for 10 minutes and then to 750° C. for 2 hours; subsequently, the temperature was ramped down to 350° C. for 10 minutes and then to 40° C. Scanning Electron Microscopy (SEM) images were taken for each of the coatings both before and after the heat treatment. For all of the coatings there were no measurable changes in surface morphology and no observable cracks or defects. The data demonstrated that $Y_2SiO_5$ material provides a stable structure for coatings on different types of substrates.

Example 3—Plasma resistance of $Y_2SiO_5$ Coatings

Three samples were prepared: 1) a SiC layer deposited by CVD on a substrate; 2) $Y_2O_3$ deposited by ALD on an aluminum nitride (AlN) substrate; and $Y_2SiO_5$ deposited by ALD on a SiC layer deposited by CVD. All samples were placed in an AlN heater a temperature of 650° C. and exposed to an oxygen ($O_2$) plasma for 41 hours. Scanning Electron Microscopy (SEM) images were taken for each of the samples both before and after the heat treatments. The CVD SiC sample 1) showed erosion as a result of the hot $O_2$ plasma process. For the $Y_2SiO_5$ on SiC sample 3), there was no measurable change in surface morphology and no observable cracks or defects. Additional samples were prepared for $Y_2SiO_5$ deposited on an AlN substrate and $Y_2Si_2O_5$ deposited on AlN and CVD SiC substrates. For all of these additional samples, the SEM results showed the same structural stability of the coatings throughout the hot $O_2$ plasma process.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:
1. An article comprising:
   a body, wherein the body comprises a material selected from the group consisting of aluminum nitride, graphite, silicon carbide, tantalum carbide and combinations thereof; and
   a rare earth metal containing silicate coating on a surface of the body, the rare earth metal containing silicate coating having a thickness of about 3 nm to about 250 µm,
   wherein the rare earth metal containing silicate coating comprises at least one of yttrium monosilicate ($Y_2SiO_5$), yttrium disilicate ($Y_2Si_2O_7$), erbium monosilicate ($Er_2SiO_5$), erbium disilicate ($Er_2Si_2O_7$), tantalum monosilicate ($Ta_2SiO_5$), tantalum disilicate ($Ta_2Si_2O_7$), iridium monosilicate ($Ir_2SiO_5$), iridium disilicate ($Ir_2Si_2O_7$), rhodium monosilicate ($Rh_2SiO_5$), rhodium disilicate ($Rh_2Si_2O_7$), lanthanum monosilicate ($La_2SiO_5$), lanthanum disilicate ($La_2Si_2O_7$), lutetium monosilicate ($Lu_2SiO_5$), lutetium disilicate ($Lu_2Si_2O_7$), scandium monosilicate ($Sc_2SiO_5$), scandium disilicate ($Sc_2Si_2O_7$), gadolinium monosilicate ($Gd_2SiO_5$), gadolinium disilicate ($Gd_2Si_2O_7$), samarium monosilicate ($Sm_2SiO_5$), samarium disilicate ($Sm_2Si_2O_7$), dysprosium monosilicate ($Dy_2SiO_5$), dysprosium disilicate ($Dy_2Si_2O_7$) and combinations thereof.

2. The article of claim 1, wherein the article is a heater or a susceptor for a processing chamber.

3. The article of claim 1, wherein the material of the body has a coefficient of thermal expansion (CTE) of about $4.0 \times 10^{-6}$/K to about $6.5 \times 10^{-6}$/K and wherein the rare earth metal containing silicate coating on the surface of the body has a CTE of about $4.5 \times 10^{-6}$/K to about $7.0 \times 10^{-6}$/K.

4. The article of claim 1, wherein the rare earth metal containing silicate coating comprises a rare earth metal monosilicate and a rare earth metal disilicate at a volume ratio (monosilicate:disilicate) of about 1:20 to about 20:1.

5. The article of claim 1, further comprising:
a buffer layer between the rare earth metal containing silicate coating and the surface of the body.

6. The article of claim 1, wherein the rare earth metal containing silicate coating comprises:
a multi-layer stack comprising alternating layers of a rare earth metal monosilicate and a rare earth metal disilicate,
wherein the rare earth metal monosilicate comprises at least one of $Y_2SiO_5$, $Er_2SiO_5$, $Ta_2SiO_5$, $Ir_2SiO_5$, $Rh_2SiO_5$, $La_2SiO_5$, $Lu_2SiO_5$, $Sc_2SiO_5$, $Gd_2SiO_5$, $Sm_2SiO_5$ and $Dy_2SiO_5$, and
wherein the rare earth metal disilcate comprises at least one of $Y_2Si_2O_7$, $Er_2Si_2O_7$, $Ta_2Si_2O_7$, $Ir_2Si_2O_7$, $Rh_2Si_2O_7$, $La_2Si_2O_7$, $Lu_2Si_2O_7$, $Sc_2Si_2O_7$, $Gd_2Si_2O_7$, $Sm_2Si_2O_7$ and $Dy_2Si_2O_7$.

7. The article of claim 1, further comprising a rare earth metal containing oxide coating over the rare earth metal containing silicate coating, the rare earth metal containing oxide comprising at least one of yttrium oxide ($Y_2O_3$), erbium oxide ($Er_2O_3$), tantalum oxide ($Ta_2O_5$), iridium oxide ($Ir_2O_3$), rhodium oxide ($Rh_2O_3$), lanthanum oxide ($La_2O_3$), lutetium oxide ($Lu_2O_3$), scandium oxide ($Sc_2O_3$), gadolinium oxide ($Gd_2O_3$), samarium oxide ($Sm_2O_3$) dysprosium oxides ($Dy_2O_3$), a $Y_2O_3$ and $ZrO_2$ solid solution, a mixture of $Y_4Al_2O_9$ and a $Y_2O_3$ and $ZrO_2$ solid solution and combinations thereof.

8. The article of claim 7, wherein the rare earth metal containing oxide coating comprises a solid solution of $Y_2O_3$-$ZrO_2$ comprising $Y_2O_3$ at 10-20 mol % and $ZrO_2$ at 80-90 mol %, or $Y_2O_3$ at 20-30 mol % and $ZrO_2$ at 70-80 mol %, or $Y_2O_3$ at 30-40 mol % and $ZrO_2$ at 60-70 mol %, or $Y_2O_3$ at 40-50 mol % and $ZrO_2$ at 50-60 mol %, or $Y_2O_3$ at 60-70 mol % and $ZrO_2$ at 30-40 mol %, or $Y_2O_3$ 70-80 mol % and $ZrO_2$ at 20-30 mol %, or $Y_2O_3$ at 80-90 mol % and $ZrO_2$ at 10-20 mol %.

9. The article of claim 1, wherein the component comprises at least one gas hole, wherein the at least one gas hole has an aspect ratio of length to diameter (L:D) of about 5:1 to about 100:1, and wherein the rare earth metal containing silicate coating conformally covers the body and a surface of the gas hole.

10. The article of claim 1, wherein the body comprises silicon carbide, and the rare earth metal containing silicate coating comprises at least about 60 vol % of a yttrium silicate and less than about 40 vol % of other phases comprises at least one of $Y_2O_3$ and $SiO_2$, or
wherein the body comprises tantalum carbide, and the rare earth metal containing silicate coating comprises at least about 60 vol % of a yttrium silicate and less than about 40 vol % of other phases comprising at least one of $Y_2O_3$ and $SiO_2$, or
wherein the body comprises aluminum nitride and the rare earth metal containing silicate coating comprises at least about 60 vol % of a yttrium silicate and less than about 40 vol % of other phases comprising at least one of $Y_2O_3$ and $SiO_2$.

11. The article of claim 1, wherein the material of the body has an elastic modulus of about 320 GPa to about 460 GPa, and wherein the rare earth metal containing silicate coating on the surface of the body has an elastic modulus of about 100 GPa to about 400 GPa.

12. The article of claim 1, wherein the rare earth metal containing silicate coating comprises at least one of erbium monosilicate ($Er_2SiO_5$), erbium disilicate ($Er_2Si_2O_7$), iridium monosilicate ($Ir_2SiO_5$), iridium disilicate ($Ir_2Si_2O_7$), rhodium monosilicate ($Rh_2SiO_5$), rhodium disilicate ($Rh_2Si_2O_7$), lanthanum monosilicate ($La_2SiO_5$), lanthanum disilicate ($La_2Si_2O_7$), scandium monosilicate ($Sc_2SiO_5$), scandium disilicate ($Sc_2Si_2O_7$), gadolinium monosilicate ($Gd_2SiO_5$), gadolinium disilicate ($Gd_2Si_2O_7$), samarium monosilicate ($Sm_2SiO_5$), samarium disilicate ($Sm_2Si_2O_7$), dysprosium monosilicate ($Dy_2SiO_5$), dysprosium disilicate ($Dy_2Si_2O_7$) and combinations thereof.

13. The article of claim 1, wherein the body consists of aluminum nitride, graphite, silicon carbide or tantalum carbide, or combinations thereof.

* * * * *